(12) United States Patent
Arao et al.

(10) Patent No.: US 7,157,321 B2
(45) Date of Patent: Jan. 2, 2007

(54) SEMICONDUCTOR DEVICE AND METHOD FOR MANUFACTURING THE SAME

(75) Inventors: Tatsuya Arao, Atsugi (JP); Takeshi Noda, Atsugi (JP); Takuya Matsuo, Tondabayashi (JP); Hidehito Kitakado, Tenri (JP); Masanori Kyoho, Tenri (JP)

(73) Assignees: Sharp Kabushiki Kaisha, Osaka; Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/963,822

(22) Filed: Oct. 14, 2004

(65) Prior Publication Data

US 2005/0082537 A1    Apr. 21, 2005

(30) Foreign Application Priority Data

Oct. 16, 2003    (JP)    ............................. 2003-355882

(51) Int. Cl.
*H01L 21/338* (2006.01)
*H01L 21/84* (2006.01)

(52) U.S. Cl. .......................... 438/181; 438/154; 257/71
(58) Field of Classification Search ................ 438/154, 438/181; 257/71
See application file for complete search history.

(56) References Cited

U.S. PATENT DOCUMENTS

| | | | |
|---|---|---|---|
| 5,814,529 A | 9/1998 | Zhang | |
| 6,320,224 B1 | 11/2001 | Zhang | |
| 6,593,592 B1 * | 7/2003 | Yamazaki et al. | ............ 257/71 |
| 6,639,265 B1 | 10/2003 | Arao et al. | |
| 2001/0009283 A1 | 7/2001 | Arao et al. | |
| 2002/0055206 A1 | 5/2002 | Zhang | |
| 2004/0056296 A1 | 3/2004 | Arao et al. | |

FOREIGN PATENT DOCUMENTS

| | | |
|---|---|---|
| JP | 06-013407 | 1/1994 |
| JP | 06-260645 | 9/1994 |
| JP | 11-097714 | 4/1999 |
| JP | 2001-290171 | 10/2001 |

\* cited by examiner

*Primary Examiner*—Michael Lebentritt
*Assistant Examiner*—Elias Ullah
(74) *Attorney, Agent, or Firm*—Eric J. Robinson; Robinson Intellectual Property Law Office, P.C.

(57) ABSTRACT

A semiconductor device that can be manufactured with a reduced cost by decreasing the number of masks is disclosed, and a method for manufacturing the semiconductor device is disclosed. The method for manufacturing the semiconductor device comprises the steps of: forming a semiconductor layer 3 having a source and a drain regions 10, 11, and LDD regions 16, 17; a gate insulating film 5; and a gate electrode 6; forming a first and a second interlayer insulating films 24, 25 over the gate electrode 6 and the gate insulating film 5; forming contact holes 25a, 25c to these interlayer insulating films so as to be located over each of the source region and the drain region; and an opening portion 25b to these interlayer insulating films so as to be located over the gate electrode and the LDD region; forming a second gate electrode 26b by a conductive film in the opening portion so as to cover the gate electrode and the LDD region; and a pixel electrode 26a over the second interlayer insulating film; removing the gate insulating film in the contact hole; and forming wirings 27, 28 connected to each the source region and the drain region.

66 Claims, 7 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device. Specifically, the present invention relates to a semiconductor device that can be manufactured in a reduced cost by decreasing the number of masks, and a method for the semiconductor device.

2. Related Art

A transistor is provided over a substrate that constitutes a liquid crystal display device. As the transistor, a pixel transistor that is required to display an image and a drive circuit transistor that is required to drive the pixel transistor are used. For the pixel transistor, a LDD (Lightly Doped Drain) transistor is used to reduce an OFF current. For the drive circuit transistor, a gate overlap LDD (GOLD) transistor that requires high load current is used to obtain high reliability and a high ON current.

In order to manufacture a large panel, it is necessary to use a low resistance wiring for a source wiring and a gate wiring of a pixel portion. Therefore, a low resistance wiring is used as a gate electrode, or a low resistance wiring is separately provided.

Reference 1: Unexamined Patent Publication No. 2001-290171 (pp. 6 to 19, FIGS. 1 to 5)

For example, in order to manufacture a transparent liquid crystal panel by only an N-channel transistor for the simplification of processes, at least six masks are required when a GOLD transistor and a LDD transistor are simultaneously manufactured as described above.

In the case that aluminum (Al) that has low resistance is used as a gate electrode material, heat treatment at high temperature can not be carried out after forming an impurity region of a transistor since the Al has low heat-resisting properties. Further, in the case that a gate electrode in a GOLD structure that overlaps a LDD region is formed, it becomes difficult to activate the LDD region overlapped with the gate electrode by laser irradiation. However, the reliability of a transistor may be decreased without the activation.

It is also possible that a GOLD structure is manufactured by a low resistance wiring after an impurity region is sufficiently heat activated by forming a gate electrode by a material having heat-resisting properties. However, six masks are also required in this instance, and it is difficult to reduce the number of masks. In order to reduce the manufacturing cost in future, the number of masks is required to be further reduced.

SUMMARY OF THE INVENTION

In view of the foregoing, it is an object of the present invention to provide a semiconductor device that can be manufactured in a reduced cost by decreasing the number of masks, and a method for the semiconductor device.

For solving the foregoing problems, the present invention provides a method for manufacturing a semiconductor device that comprises the steps of:

forming a semiconductor layer having a source region, a drain region, and a LDD region; a gate insulating film; and a gate electrode;

forming an interlayer insulating film over the gate electrode and the gate insulating film;

forming a first opening portion in the interlayer insulating film so as to be located over each of the source region and the drain region; and a second opening portion in the interlayer insulating film so as to be located over the LDD region;

forming a second gate electrode by a conductive film in the second opening portion so as to cover the gate electrode and the LDD region; and a pixel electrode by the conductive film over the interlayer insulating film;

removing the gate insulating film in the first opening portion; and forming a wiring connected to each the source region and the drain region in the first opening portion and over the interlayer insulating film.

According to the above described method for manufacturing the semiconductor device, the processing for forming the first opening portion, which forms the wiring for connecting to the source region and the drain region, is carried out at twice. The interlayer insulating film is processed at the first processing. The gate insulating film is formed at the second processing. By this twice processing, the second opening portion for forming a GOLD structure can be simultaneously processed with the first processing. Then, the second processing is carried out after forming the second gate electrode. Consequently, the gate insulating film can be processed at the second processing using the second gate electrode and the interlayer insulating film as a mask instead of using a processing mask. As a result, the number of masks can be reduced compared to the case that the first opening portion is processed at once.

A method for manufacturing a semiconductor device according to the present invention comprises the steps of:

forming a semiconductor layer having a source region, a drain region, and a LDD region; a gate insulating film; and a gate electrode;

forming an interlayer insulating film over the gate electrode and the gate insulating film;

forming a first opening portion in the interlayer insulating film so as to be located over each of the source region and the drain region; and a second opening portion in the interlayer insulating film so as to be located over the LDD region;

forming a second gate electrode by a first conductive film in the second opening portion so as to cover the gate electrode and the LDD region; and a wiring by the first conductive film over the interlayer insulating film;

removing the gate insulating film in the first opening portion; and forming a source electrode and a drain electrode by a second conductive film to connect to each of the source region, the drain region, and the wiring in the first opening portion and over the interlayer insulating film; and a pixel electrode by the second conductive film over the interlayer insulating film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region;

forming a second gate electrode by a conductive film in the second opening portion so as to cover the gate electrode and the LDD region; and a pixel electrode by the conductive film over the second interlayer insulating film;

removing the gate insulating film in the first opening portion; and forming a wiring connected to each of the source region and the drain region in the first opening portion and over the second interlayer insulating film.

According to the above described method for manufacturing the semiconductor device, the processing for forming the first opening portion, which forms the wiring for connecting to the source region and the drain region, is carried out at twice. The first interlayer insulating film and the second interlayer insulating film are processed at the first processing. The gate insulating film is formed at the second processing. By this twice processing, the second opening portion for forming a GOLD structure can be simultaneously processed with the first processing. Then, the second processing is carried out after forming the second gate electrode. Consequently, the gate insulating film can be processed at the second processing using the second gate electrode and the second interlayer insulating film as a mask instead of using a processing mask. As a result, the number of masks can be reduced compared to the case that the first opening portion is processed at once.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region;

forming a second gate electrode by a first conductive film in the second opening portion so as to cover the gate electrode and the LDD region; and a wiring by the first conductive film over the second interlayer insulating film;

removing the gate insulating film in the first opening portion; and forming a source electrode and a drain electrode by a second conductive film to connect to each of the source region, the drain region, and the wiring in the first opening portion and over the second interlayer insulating film; and a pixel electrode by the second conductive film over the second interlayer insulating film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the second interlayer insulating film so as to be located over each of the source region and the drain region; and a second opening portion in the second interlayer insulating films so as to be located over the LDD region;

forming a second gate electrode by a conductive film in the second opening portion so as to cover the gate electrode and the LDD region; and a pixel electrode by the conductive film over the second interlayer insulating film;

removing the first interlayer insulating film and the gate insulating film in the first opening portion; and forming a wiring connected to each of the source region and the drain region in the first opening portion and over the second interlayer insulating film.

According to the above described method for manufacturing the semiconductor device, the processing for forming the first opening portion, which forms the wiring for connecting to the source region and the drain region, is carried out at twice. The second interlayer insulating film is processed at the first processing. The first interlayer insulating film and gate insulating film are formed at the second processing. By this twice processing, the second opening portion for forming a GOLD structure can be simultaneously processed with the first processing. Then, the second processing is carried out after forming the second gate electrode. Consequently, the first interlayer insulating film and the gate insulating film can be processed at the second processing using the second gate electrode and the second interlayer insulating film as a mask instead of using a processing mask. As a result, the number of masks can be reduced compared to the case that the first opening portion is processed at once.

A method for manufacturing a semiconductor device according to the present invention, wherein a capacitor portion including a first capacitor electrode and a second capacitor electrode is formed by forming a third opening portion in the second interlayer insulating film when the second opening portion is formed; by forming the first capacitor electrode by the conductive film in the third opening portion when the pixel electrode is formed; and by forming a second capacitor electrode in the third opening portion when the wiring is formed.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the second interlayer insulating film so as to be located over each of the source region and the drain region; and a second opening portion in the second interlayer insulating films so as to be located over the LDD region;

forming a second gate electrode by a first conductive film in the second opening portion so as to cover the gate electrode and the LDD region; and a wiring by the first conductive film over the second interlayer insulating film;

removing the first interlayer insulating film and the gate insulating film in the first opening portion; and forming a source electrode and a drain electrode by a second conductive film to connect to each of the source region, the drain region, and the wiring in the first opening portion and over the second interlayer insulating film; and a pixel electrode by the second conductive film over the second interlayer insulating film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over the source region and the drain region; and a second opening portion in the first interlayer insulating film and the second interlayer insulating film so as to be located over the LDD region, by etching the first interlayer insulating film and the second interlayer insulating film;

forming a first conductive film in the second opening portion and over the second interlayer insulating film;

forming a second gate electrode by the first conductive film in the opening portion so as to cover the gate electrode and the LDD region; and a pixel electrode formed by the first conductive film over the second interlayer insulating film, by etching the first conductive film;

etching off the gate insulating film in the first opening portion;

depositing a second conductive film in the first opening portion and over the second interlayer insulating film; and forming a wiring connected to each of the source region and the drain region in the first opening portion and over the second interlayer insulating film by etching the second conductive film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region, by etching the first interlayer insulating film and the second interlayer insulating film;

forming a first conductive film in the second opening portion and over the second interlayer insulating film;

forming a second gate electrode by the first conductive film in the second opening portion so as to cover the gate electrode and the LDD region; and a wiring formed by the first conductive film over the second interlayer insulating film, by etching the first conductive film;

etching off the gate insulating film in the first opening portion;

depositing a second conductive film in the first opening portion and over the second interlayer insulating film; and forming a source electrode and a drain electrode by a second conductive film to connect to each of the source region, the drain region, and the wiring in the first opening portion and over the second interlayer insulating film; and a pixel electrode by the second conductive film over the second interlayer insulating film, by etching the second conductive film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating films so as to be located over the LDD region, by etching the second interlayer insulating film;

forming a first conductive film in the second opening portion and over the second interlayer insulating film;

forming a second gate electrode by the first conductive film in the second opening portion so as to cover the gate electrode and the LDD region; and a pixel electrode formed by the first conductive film over the second interlayer insulating film, by etching the first conductive film;

etching off the first interlayer insulating film and the gate insulating film in the first opening portion;

depositing a second conductive film in the first opening portion and over the second interlayer insulating film; and forming a wiring connected to each of the source region and the drain region in the first opening portion and over the second interlayer insulating film by etching the second conductive film.

A method for manufacturing a semiconductor device according to the present invention comprises the steps of:

forming a semiconductor layer having a source region, a drain region, and a LDD region; a gate insulating film; and a gate electrode;

forming a first interlayer insulating film over the gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region, by etching the second interlayer insulating film;

forming a first conductive film in the second opening portion and over the second interlayer insulating film;

forming a second gate electrode by the first conductive film in the opening portion so as to cover the gate electrode and the LDD region; and a wiring formed by the first conductive film over the second interlayer insulating film, by etching the first conductive film;

etching off the first interlayer insulating film and the gate insulating film in the first opening portion;

depositing a second conductive film in the first opening portion and over the second interlayer insulating film; and forming a source electrode and a drain electrode by a second conductive film to connect to each of the source region, the drain region, and the wiring in the first opening portion and over the second interlayer insulating film; and a pixel electrode by the second conductive film over the second interlayer insulating film, by etching the second conductive film.

A method for manufacturing a semiconductor device according to the present invention comprises the steps of:

forming a first semiconductor layer and a second semiconductor layer over a substrate;

forming a gate insulating film over the first semiconductor layer, the second semiconductor layer, and the substrate;

introducing an impurity into a source region and a drain region of each the first semiconductor layer and the second semiconductor layer;

forming a gate electrode over each the first semiconductor layer and the second semiconductor layer via the gate insulating film;

introducing an impurity into a LDD region of each the first semiconductor layer and the second semiconductor layer;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region of the first semiconductor layer, by etching the first interlayer insulating film and the second interlayer insulating film;

forming a first conductive film in the second opening portion and over the second interlayer insulating film;

forming a second gate electrode by the first conductive film in the opening portion so as to cover the gate electrode and the LDD region; and a pixel electrode formed by the first conductive film over the second interlayer insulating film, by etching the first conductive film;

etching off the gate insulating film in the first opening portion;

depositing a second conductive film in the first opening portion and over the second interlayer insulating film; and forming a wiring connected to each of the source region and the drain region in the first opening portion and over the second interlayer insulating film by etching the second conductive film.

A method for manufacturing a semiconductor device according to the present invention, wherein the wiring can be also formed over the second gate electrode. Especially, the wiring formed over the second gate electrode can serve effectively as a light shielding film for preventing a TFT from being irradiated with light in the case of using a transparent conductive film as the second gate electrode.

A method for manufacturing a semiconductor device according to the present invention, wherein the gate insulating film in the first opening portion can be etched off by using as an etching mask at least one selected from the group consisting of resist which is used as an etching mask for forming the second gate electrode; the second gate electrode; the pixel electrode; and the second interlayer insulating film.

A method for manufacturing a semiconductor device according to the present invention comprises the steps of:

forming a first semiconductor layer and a second semiconductor layer over a substrate;

forming a gate insulating film over the first semiconductor layer, the second semiconductor layer, and the substrate;

introducing an impurity into a source region and a drain region of each the first semiconductor layer and the second semiconductor layer;

forming a gate electrode over each the first semiconductor layer and the second semiconductor layer via the gate insulating film;

introducing an impurity into a LDD region of the first semiconductor layer and the second semiconductor layer;

forming a first interlayer insulating film over the gate electrode and the gate insulating film;

forming a second interlayer insulating film over the first interlayer insulating film;

forming a first opening portion in the first interlayer insulating film and the second interlayer insulating film so as to be located over the source region and the drain region; and a second opening portion in the first interlayer insulating film and the second interlayer insulating film so as to be located over the LDD region of the first semiconductor layer, by etching the first interlayer insulating film and the second interlayer insulating film;

forming a first conductive film in the second opening portion and over the second interlayer insulating film;

forming a second gate electrode by the first conductive film in the second opening portion so as to cover the gate electrode and the LDD region; and a wiring formed by the first conductive film over the second interlayer insulating film, by etching the first conductive film;

etching off the gate insulating film in the first opening portion;

depositing a second conductive film in the first opening portion and over the second interlayer insulating film; and forming a source electrode and a drain electrode to connect to each of the source region, the drain region, and the wiring in the first opening portion and over the second interlayer insulating film; and a pixel electrode by the second conductive film over the second interlayer insulating film, by etching the second conductive film.

A method for manufacturing a semiconductor device according to the present invention, wherein the gate insulating film in the first opening portion can be etched off by using as an etching mask at least one selected from the group consisting of resist which is used as an etching mask for forming the second gate electrode; the second gate electrode; the wiring; and the second interlayer insulating film.

A method for manufacturing a semiconductor device according to the present invention comprises the steps of:

forming a first semiconductor layer and a second semiconductor layer over a substrate;

forming a gate insulating film over the first semiconductor layer, the second semiconductor layer, and the substrate;

introducing an impurity into a source region and a drain region of each the first semiconductor layer and the second semiconductor layer;

forming a gate electrode over each of the first semiconductor layer and the second semiconductor layer via the gate insulating film;

introducing an impurity into a LDD region of each the first semiconductor layer and the second semiconductor layer;

forming a first interlayer insulating film over the gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region of the first semiconductor layer, by etching the second interlayer insulating film;

forming a first conductive film in the second opening portion and over the second interlayer insulating film;

forming a second gate electrode by the first conductive film in the second opening portion so as to cover the gate electrode and the LDD region; and a pixel electrode formed by the first conductive film over the second interlayer insulating film, by etching the first conductive film;

etching off the first interlayer insulating film and the gate insulating film in the first opening portion;

depositing a second conductive film in the first opening portion and over the second interlayer insulating film; and forming a wiring connected to each of the source region and the drain region in the first opening portion and over the second interlayer insulating film by etching the second conductive film.

A method for manufacturing a semiconductor device according to the present invention, wherein the first interlayer insulating film and the gate insulating film in the first opening portion can be etched off by using as an etching mask at least one selected from the group consisting of resist which is used as an etching mask for forming the second gate electrode; the second gate electrode; the pixel electrode; and the second interlayer insulating film.

A method for manufacturing a semiconductor device according to the present invention, wherein the first interlayer insulating film can be formed by a film made of a material having heat-resisting properties, and heat activated.

A method for manufacturing a semiconductor device according to the present invention comprises the steps of:

forming a first semiconductor layer and a second semiconductor layer over a substrate;

forming a gate insulating film over the first semiconductor layer, the second semiconductor layer, and the substrate;

introducing an impurity into a source region and a drain region of each the first semiconductor layer and the second semiconductor layer;

forming a gate electrode over each the first semiconductor layer and the second semiconductor layer via the gate insulating film;

introducing an impurity into a LDD region of the first semiconductor layer and the second semiconductor layer;

forming a first interlayer insulating film over the gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region of the first semiconductor layer, by etching the second interlayer insulating film;

forming a first conductive film in the second opening portion and over the second interlayer insulating film;

forming a second gate electrode by the first conductive film in the second opening portion so as to cover the gate electrode and the LDD region; and a wiring formed by the first conductive film over the second interlayer insulating film, by etching the first conductive film;

etching off the first interlayer insulating film and the gate insulating film in the first opening portion;

depositing a second conductive film in the first opening portion and over the second interlayer insulating film; and forming a source electrode and a drain electrode by a second conductive film to connect to each of the source region, the drain region, and the wiring in the first opening portion and over the second interlayer insulating film; and a pixel electrode by the second conductive film over the second interlayer insulating film, by etching the second conductive film.

A method for manufacturing a semiconductor device according to the present invention, wherein the first interlayer insulating film and the gate insulating film in the first opening portion can be etched off by using as an etching mask at least one selected from the group consisting of resist which is used as an etching mask for forming the second gate electrode; the second gate electrode; the wiring; and the second interlayer insulating film.

A method for manufacturing a semiconductor device according to the present invention, wherein after an impurity is introduced into the source region, the drain region, and the LDD region; the source region, the drain region, and the LDD region can be activated by laser irradiation or heat treatment.

A method for manufacturing a semiconductor device according to the present invention, wherein the gate electrode is preferably formed by a film made of aluminum or an alloy of aluminum, or a lamination film including a film made of aluminum or an alloy of aluminum.

A method for manufacturing a semiconductor device according to the present invention, wherein the first interlayer insulating film is preferably a silicon nitride film, and the second interlayer insulating film is preferably organic resin.

A semiconductor device according to the present invention comprises:

a semiconductor layer having a source region, a drain region, and a LDD region;

a gate electrode formed over the semiconductor layer via a gate insulating film;

an interlayer insulating film formed over the gate electrode and the gate insulating film;

a contact hole formed to the interlayer insulating film and the gate insulating film so as to be located over each of the source region and the drain region;

an opening portion formed in the interlayer insulating film so as to be located over the LDD region;

a second gate electrode formed in the opening portion by a conductive film to cover the gate electrode and the LDD region;

a pixel electrode formed by the conductive film over the interlayer insulating film; and a wiring formed in the contact hole and over the interlayer insulating film to connect to each of the source region and the drain region.

A semiconductor device according to the present invention comprises:

a semiconductor layer having a source region, a drain region, and a LDD region;

a gate electrode formed over the semiconductor layer via a gate insulating film;

an interlayer insulating film formed over the gate electrode and the gate insulating film;

a contact hole formed to the interlayer insulating film and the gate insulating film so as to be located over each of the source region and the drain region;

an opening portion formed in the interlayer insulating film so as to be located over the LDD region;

a second gate electrode formed by a first conductive film to cover the gate electrode and the LDD region in the opening portion;

a wiring formed by the first conductive film over the interlayer insulating film;

a source electrode and a drain electrode formed by a second conductive film to connect to each of the source region, the drain region, and the wiring in the contact hole and over the interlayer insulating film; and a pixel electrode formed by the second conductive film formed over the interlayer insulating film.

A semiconductor device according to the present invention comprises:

a semiconductor layer having a source region, a drain region, and a LDD region;

a gate electrode formed over the semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the first interlayer insulating film and the second interlayer insulating film so as to be located over the LDD region;

a second gate electrode formed by a conductive film to cover the gate electrode and the LDD region in the opening portion;

a pixel electrode formed by the conductive film over the second interlayer insulating film; and a wiring formed in the contact hole and over the second interlayer insulating film to connect to each of the source region and the drain region.

A semiconductor device according to the present invention comprises:

a semiconductor layer having a source region, a drain region, and a LDD region;

a gate electrode formed over the semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the first interlayer insulating film and the second interlayer insulating film so as to be located over the LDD region;

a second gate electrode formed by a first conductive film to cover the gate electrode and the LDD region in the opening portion;

a wiring formed by the first conductive film over the second interlayer insulating film;

a source electrode and a drain electrode formed by a second conductive film to connect to each of the source region, the drain region, and the wiring, in the contact hole and over the second interlayer insulating film; and a pixel electrode formed by the second conductive film formed over the second interlayer insulating film.

A semiconductor device according to the present invention comprises:

a semiconductor layer having a source region, a drain region, and a LDD region;

a gate electrode formed over the semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the second interlayer insulating film so as to be located over the LDD region;

a second gate electrode formed by a conductive film to cover the gate electrode and the LDD region in the opening portion;

a pixel electrode formed by the conductive film over the second interlayer insulating film; and a wiring formed in the contact hole and over the second interlayer insulating film to connect to each of the source region and the drain region.

A semiconductor device according to the present invention comprises:

a semiconductor layer having a source region, a drain region, and a LDD region;

a gate electrode formed over the semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, the gate insulating film so as to be located over each of the source region and the drain region;

an opening portion formed in the second interlayer insulating film so as to be located over the LDD region;

a second gate electrode formed by a first conductive film to cover the gate electrode and the LDD region in the opening portion;

a wiring formed by the first conductive film over the second interlayer insulating film;

a source electrode and a drain electrode formed by a second conductive film to connect to each of the source region, the drain region, and the wiring in the contact hole and over the second interlayer insulating film; and a pixel electrode formed by the second conductive film formed over the second interlayer insulating film.

A semiconductor device according to the present invention comprises:

a first semiconductor layer and a second semiconductor layer;

a source region and a drain region formed respectively to the first semiconductor layer and the second semiconductor layer;

a gate electrode formed respectively over the first semiconductor layer and the second semiconductor layer via a-gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the first interlayer insulating film and the second interlayer insulating film so as to be located over a LDD region of the first semiconductor layer;

a second gate electrode formed by a conductive film to cover the gate electrode and the LDD region in the opening portion;

a pixel electrode formed by the conductive film over the second interlayer insulating film; and a wiring formed in the contact hole and over the second interlayer insulating film to connect to each of the source region and the drain region.

A semiconductor device according to the present invention, wherein the wiring can also be formed over the second gate electrode.

A semiconductor device according to the present invention comprises:

a first semiconductor layer and a second semiconductor layer;

a source region and a drain region formed respectively to the first semiconductor layer and the second semiconductor layer;

a gate electrode formed respectively over the first semiconductor layer and the second semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the first interlayer insulating film and the second interlayer insulating film so as to be located over a LDD region of the first semiconductor layer;

a second gate electrode formed by a first conductive film to cover the gate electrode and the LDD region in the opening portion;

a wiring formed by the first conductive film over the second interlayer insulating film;

a source electrode and a drain electrode formed by a second conductive film, which is connected to each of the source region, the drain region, and the wiring in the contact hole and over the second interlayer insulating film; and a pixel electrode formed by the second conductive film formed over the second interlayer insulating film.

A semiconductor device according to the present invention comprises:

a first semiconductor layer and a second semiconductor layer;

a source region and a drain region formed respectively to the first semiconductor layer and the second semiconductor layer;

a gate electrode formed respectively over the first semiconductor layer and the second semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the second interlayer insulating film so as to be located over a LDD region of the first semiconductor layer;

a second gate electrode formed by a conductive film to cover the gate electrode and the LDD region in the opening portion;

a pixel electrode formed by the conductive film over the second interlayer insulating film; and a wiring formed in the contact hole and over the second interlayer insulating film to connect to each of the source region and the drain region.

A method for manufacturing a semiconductor device according to the present invention, wherein the first interlayer insulating film can be formed by a film made of a material having heat-resisting properties.

A semiconductor device according to the present invention comprises:

a first semiconductor layer and a second semiconductor layer;

a source region and a drain region formed respectively to the first semiconductor layer and the second semiconductor layer;

a gate electrode formed respectively over the first semiconductor layer and the second semiconductor layer via a gate insulating film;

a first interlayer insulating film formed over the gate electrode and the gate insulating film;

a second interlayer insulating film formed over the first interlayer insulating film;

a contact hole formed to the first interlayer insulating film, the second interlayer insulating film, and the gate insulating film so as to be located over each of the source region and the drain region;

an opening portion formed in the second interlayer insulating film so as to be located over a LDD region of the first semiconductor layer;

a second gate electrode formed by a first conductive film to cover the gate electrode and the LDD region in the opening portion;

a wiring formed by the first conductive film over the second interlayer insulating film;

a source electrode and a drain electrode formed by a second conductive film to connect to each of the source region, the drain region, and the wiring in the contact hole and over the second interlayer insulating film; and a pixel electrode formed by the second conductive film formed over the second interlayer insulating film.

As explained above, a semiconductor device that can be manufactured at reduced cost by decreasing the number of masks, and a method for manufacturing the semiconductor device can be provided according to the present invention.

BRIEF DESCRIPTION OF THE DRAWINGS

FIG. 4A is a cross-sectional view for showing the process next to that illustrated in FIG. 3C;

FIG. 5A is a cross-sectional view for showing the process next to that illustrated in FIG. 4C;

DESCRIPTION OF THE INVENTION

Hereinafter, embodiment of the present invention is explained with reference to the drawings.

Embodiment 1

FIGS. 1A to 1E are cross-sectional views for showing a semiconductor device according to Embodiment 1 of the present invention.

Figure 1A:
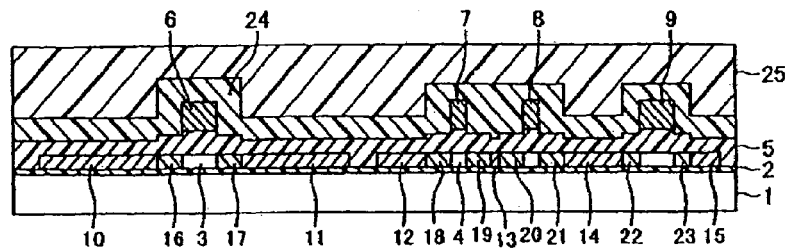
FIGS. 1A to 1E are cross-sectional views for showing a method for manufacturing a semiconductor device according to Embodiment 1 of the present invention.

As shown in FIG. 1A, a glass substrate 1 is prepared to form a base insulating film 2 by a silicon oxynitride film or the like over the glass substrate 1. The base insulating film 2 is formed to serve as a barrier film (film for preventing movable ions) that prevents alkali metals contained in the glass substrate 1 from dispersing into a semiconductor layer. For example, the base insulating film 2 is formed by a SiN film with a thickness of from 50 to 100 nm and a $SiO_2$ film with a thickness of from 50 to 100 nm as a stress relaxation film by CVD or sputtering. Instead of the SiN film, a silicon nitride film containing oxygen (SiNO film) can be used. Instead of the $SiO_2$ film, a silicon oxide film containing nitrogen (SiON film) or a TEOS film can be used. Further, a quartz substrate can be used instead of the glass substrate.

An amorphous silicon film with a thickness of from 40 to 100 nm is formed over the base insulating film 2 by plasma CVD, evacuation CVD, or sputtering.

Then, solution containing a metal element, for example, nickel acetate solution containing nickel of 1 to 100 ppm in weight, is coated by means of a spinner by spin coating to form a layer containing a catalytic element (not shown). In addition, solution containing nickel is used in this instance, however, solution containing another metal element can be used. As another metal element, one kind or a plurality kinds of element selected from the group consisting of iron, cobalt, ruthenium, palladium, osmium, iridium, platinum, copper, and aurum can be used.

Thereafter, the substrate 1 is heated at 550° C. for 1 hour to release hydrogen that is contained in the amorphous silicon film. Then, the substrate 1 is heated at 500 to 650° C. for 1 to 24 hours (for example, 550° C. for 4 hours) to form a crystalline silicon film over the base insulating film 2. The substrate 1 may be heated by laser irradiation.

For improving the crystallinity of the crystalline silicon film, the crystalline silicon film is irradiated with laser light.

A resist film (not shown) is coated over the crystalline silicon film to be exposed and developed. As a result, a first resist pattern is formed over the crystalline silicon film. Then, the crystalline silicon film is etched by means of the resist pattern as a mask to form island like semiconductor layers (active layers) 3, 4 by the crystalline silicon film over the base insulating film 2.

A gate insulating film 5 is formed by a SiON film by plasma CVD or sputtering over the semiconductor layers 3, 4, and a base insulating film 2. High concentration impurities are doped into source regions and drain regions 10 to 15 of the semiconductor layers 3, 4. A first conductive film is formed over the gate insulating film 5. The first conductive film may be a film made of Al or Al alloys, or a lamination layer including a film made of Al or Al alloys. Further, channel doping can be carried out to control a threshold voltage of a transistor before forming a first conductive film.

A photoresist film (not shown) is coated over the first conductive film to be exposed and developed. As a result, a second resist pattern is formed over the first conductive film. Then, the first conductive film is selectively etched by means of the second resist pattern as a mask. Accordingly, a gate electrode 6 is formed by the first conductive film over the semiconductor layer 3 via the gate insulating film 5; gate electrodes 7 to 9 are formed by the first conductive film over the semiconductor layer 4 via the gate insulating film 5; and a gate wiring is formed in a region that is not shown. In addition, a semiconductor device according to this embodiment can be applied to a large panel by using a film made of Al or Al alloys, or a lamination layer including a film made of Al or Al alloys for the gate electrode and the gate wiring. Then, the second resist pattern is removed.

Low concentration impurities for forming LDD regions 16 to 23 are doped into the semiconductor layers 3, 4. In addition, at least the LDD regions may be formed at the side of the drain region.

The source and drain regions 10 to 15, and the LDD regions 16 to 34 are activated by laser irradiation. In this embodiment, the gate electrodes 6 to 9 are formed by a lamination layer including a film made of Al or Al alloys that has low heat-resisting properties, consequently, the activation of impurities introduced to the semiconductor layer is carried out by laser annealing. However, in case of using materials having high heat-resisting properties for the gate electrode, heat treatment such as furnace annealing, and lamp annealing can be used to activate impurities instead of the laser annealing. Ni is introduced to a high concentration impurity region (source and drain region) by the heat treatment, accordingly, gettering can be carried out.

A first interlayer insulating film 24 is formed by a silicon nitride (SiN) film over a whole surface including the gate electrodes 6 to 9, and the gate insulating film 5. Then, a second interlayer insulating film 25 such as organic resin (for example, acrylic) having self planarity properties is formed over the first interlayer insulating film 24.

Figure 1B:
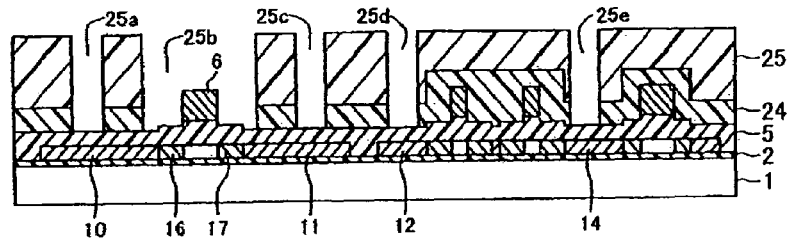

Thereafter, as shown in FIG. 1B, a photoresist film (not shown) is coated over the second interlayer insulating film 25 to be exposed and developed. As a result, a third resist pattern is formed over the second interlayer insulating film 25. Then, the first and the second interlayer insulating films 24, 25 are etched by means of the third resist pattern as a mask. Accordingly, contact holes 25*a*, 25*c* to 25*e* located over the source and the drain regions 10 to 12, 14; and an opening portion 25*b* located over the gate electrode 6 and the LDD regions 16, 17 are provided to the first and the second interlayer insulating films 24, 25. The opening portion 25*b* is formed to form a GOLD structure. The gate insulating film 5 is exposed by the contact holes 25*a*, 25*c* to 25*e* and the opening portion 25*b*.

Figure 1C:
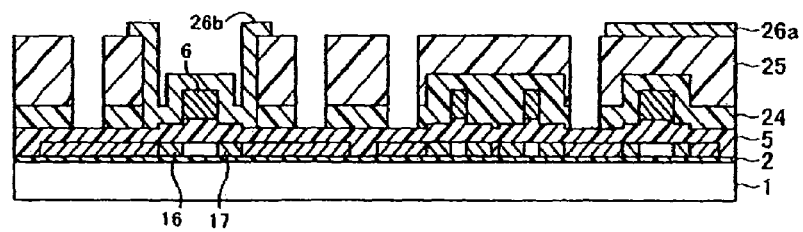

As shown in FIG. 1C, a transparent conductive film such as ITO is formed in the contact hole, in the opening portion, and over the second interlayer insulating film 25 after removing the third resist pattern. Then, a photoresist film (not shown) is coated over the transparent conductive film to be exposed and developed. As a result; a fourth resist pattern is formed over the transparent conductive film. The transparent conductive film is etched by means of the fourth resist pattern as a mask. Accordingly, a pixel electrode 26*a* is formed by the transparent conductive film over the second interlayer insulating film 25, and a second gate electrode 26*b* is formed by the transparent conductive film in the opening portion 25*b* to cover the gate electrode 6, and the LDD regions 16, 17. The gate electrode 26*b* is in contact with the gate electrode 6. A GOLD structure is formed by the gate electrode 6 and the second gate electrode 26*b*.

Figure 1D:
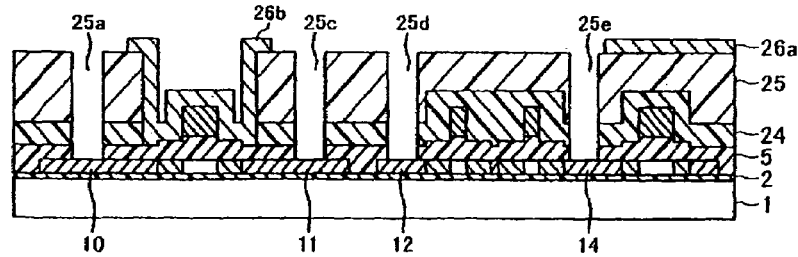

As shown in FIG. 1D, the gate insulating film 5 is etched by means of the second gate electrode 26*b* and the second interlayer insulating film 25 as masks. At this time, the gate insulating film 5 may be etched by means of the fourth resist pattern as a mask without removing the fourth resist pattern, alternatively, the gate insulating film 5 may be etched without using the fourth resist pattern as a mask after removing the fourth resist pattern. By this etching treatment, the gate insulating film 5 at the bottom of the contact holes 25*a*, 25*c* to 25*e* is etched off, and the source and drain regions 10 to 12, and 14 are exposed by the contact holes 25a, 25c to 25e. Since the pixel electrode 26 is used as an etching mask at this etching treatment, the interlayer insulating film of a light-transmitting portion is not suffered from etching damage, and so the surface of the interlayer insulating film of the light-transmitting portion becomes not rough. Consequently, the deterioration of light-transmitting properties of a pixel can be prevented.

Figure 1E:
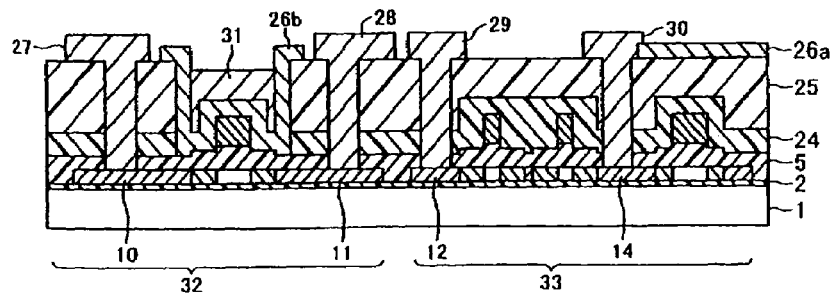

As shown in FIG. 1E, a second conductive film is formed by a lamination layer including a film made of Al or Al alloys, or a lamination layer including a film made of Al or Al alloys over a whole surface including the inside of the contact hole and the surface of the second electrode 26b. Then, a photoresist film (not shown) is coated over the second conductive film to be exposed and developed. As a result, a fifth resist pattern is formed over the second insulating film. And then, the second conductive film is etched by means of the fifth resist pattern as a mask to form wirings 27 to 30 inside the contact hole and over the second interlayer insulating film 25, and a wiring layer 31 is formed over the second gate electrode 26b. Each the wirings 27 to 30 is electrically connected to the source and drain regions 10 to 12, 14 at the bottom of the contact hole, and the wiring 30 is electrically connected to the pixel electrode 26a.

Accordingly, a thin film transistor with a GOLD structure is formed at a drive circuit portion 32, and a thin film transistor with a LDD structure is formed at a pixel portion 33 to have a double gate structure.

According to the above described Embodiment 1, an etching treatment for the contact holes 25a, 25c to 25e for forming wirings connected to the source and drain regions 10 to 12, 14 is carried out at twice. The first and the second interlayer insulating films 24, 25 are etched at the first etching, and the gate insulating film 5 is etched at the second etching. By the twice etching treatment, the opening portion 25b for forming a GOLD structure can be simultaneously etched with the first etching. Further, since the second etching is carried out after forming the second gate electrode 26b, an etching mask (resist pattern) is not required at the second etching treatment, and so the gate insulating film 5 can be etched by means of the second gate electrode 26band the second interlayer insulating film 25 as masks. As a result, the number of masks can be reduced compared to the case that the contact holes 25a, 25c to 25e are etched at once.

In addition, the thin film transistor with a LDD structure is formed in the pixel portion 33 to have a double gate structure in Embodiment 1, however, it is not limited to the double gate structure, a single gate structure can be adopted. Further, the pixel electrode and the second gate electrode are formed by transparent conductive films in Embodiment 1. The transparent conductive film is preferably used in case of transparent liquid crystal. A conductive film having high reflectivity, for example Al or the like, is preferably used in case of reflective liquid crystal.

The opening portion 25b is formed to be located over the gate electrode 6 and the LDD regions 16, 17 in Embodiment 1, however, the opening portion 25b may be at least located over the LDD region, it is not limited to be located over the gate electrode 6. The interlayer insulating film 24 is formed by a silicon nitride film and the second interlayer insulating film 25 is formed by organic resin in Embodiment 1. In case that the interlayer insulating films 24 and 25 have a high selective etching ratio for the gate insulating film 5 in the process shown in FIG. 1B, and the gate insulating film 5 serves as an etching stopper, the material for the interlayer insulating films 24 and 25 can be appropriately changed.

In Embodiment 1, the edge portion of the second gate electrode 26b with a GOLD structure is extended to the surface of the second interlayer insulating film 25. However, in case that the second gate electrode 26b is located over the LDD region, the edge portion of the second gate electrode 26b is not required to be extended to the surface of the second interlayer insulating film 25.

In Embodiment 1, the wiring layer 31 is left over the second gate electrode 26b, however, the wiring layer 31 is not always required to be left. When a transparent conductive film is used for the second gate electrode 26b, there is an advantage that the wiring layer 31 left over the second gate electrode 26b serves as a light-shielding film for preventing a TFT from being irradiated with light.

In Embodiment 1, the thin film transistor with a GOLD structure is formed at the drive circuit portion 32, however, both the thin film transistor with a GOLD structure and the thin film transistor with a LDD structure can be formed at the drive circuit portion 32.

In Embodiment 1, a method for manufacturing a thin film transistor of single conductivity type (for example, an N-channel type) over the glass substrate 1 is explained. However, a thin film transistor of a P-channel type can also be manufactured to provide a CMOS over a glass substrate. In this instance, one more mask for forming the impurity region of the P-channel type thin film transistor is required.

Embodiment 2

FIGS. 2A to 2E are cross-sectional views for showing a method for manufacturing a semiconductor device according to Embodiment 2 of the present invention. Through FIGS. 2A to 2E, like components are denoted by like numerals as of FIGS. 1A to 1E and will not be further explained hereinafter.

Figure 2A:
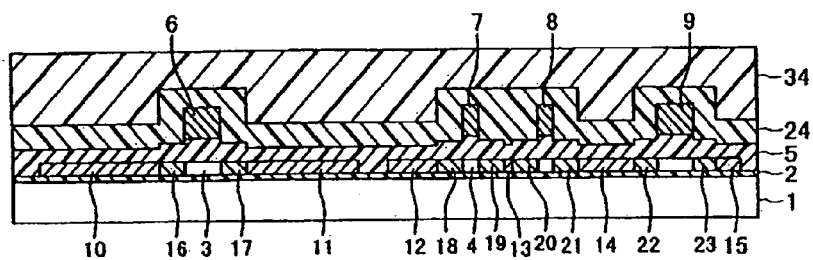
FIGS. 2A to 2E are cross-sectional views for showing a method for manufacturing a semiconductor device according to Embodiment 2 of the present invention.

The process shown in FIG. 2A up to the formation of a first interlayer insulating film 24 formed by a silicon nitride film (Si film) over a whole surface including gate electrodes 6 to 9 and a gate insulating film 5 is explained in Embodiment 1, and is not further explained.

A second interlayer insulating film 34 formed by organic resin is formed over the first interlayer insulating film 24.

Figure 2B:
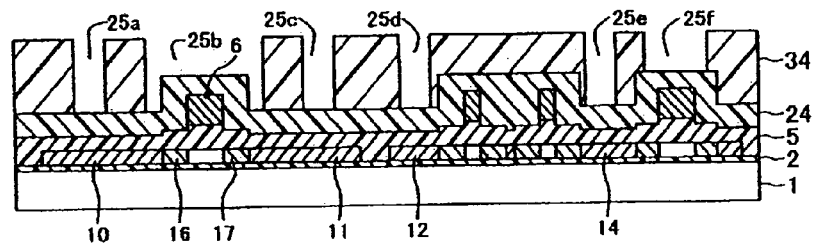

Thereafter, as shown in FIG. 2B, a photoresist film (not shown) is coated over the second interlayer insulating film 34 to be exposed and developed. As a result, a third resist pattern is formed over the second interlayer insulating film 34. Then, the second interlayer insulating film 34 is etched by means of the third resist pattern as a mask. Accordingly, contact holes 25a, 25c to 25e located over the source and drain regions 10 to 12, 14; an opening portion 25b located over the gate electrode 6 and the LDD regions 16, 17; and an opening portion 25f located over the gate electrode 9 are provided to the second interlayer insulating film 34. The opening portion 25b is formed to form a GOLD structure. The first interlayer insulating film 24 is exposed by the contact holes 25a, 25c to 25e, and the opening portions 25b, 25f. The opening portion 25f is an opening for stacking and increasing pixel capacity. That is, a capacity portion can be additionally provided in the opening portion 25f, for example, pixel capacity can be increased by forming additionally a capacity portion by utilizing the gate electrode 9, the first interlayer insulating film 24, an after-mentioned pixel electrode 26c, and the wiring layer 31.

Further, organic resin that is a photosensitive material may be used for the second interlayer insulating film 34. In case of using a photosensitive material, it is not required to form a resist pattern over the second interlayer insulating film 34. Further, the contact holes 25a, 25c to 25e, and the opening portions 25b, 25f can be formed by directly exposing and developing the second interlayer insulating film 34. Moreover, the first interlayer insulating film 24 is not etched at all.

Figure 2C:
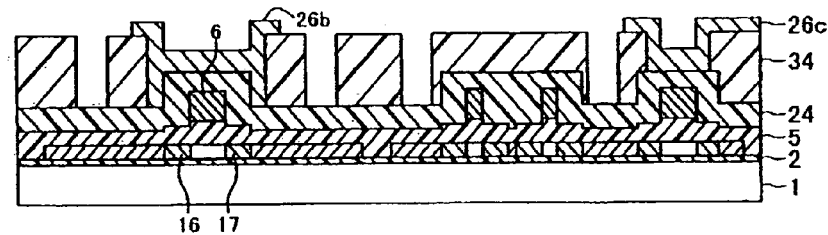

As shown in FIG. 2C, a transparent conductive film such as ITO is formed in the contact hole, the opening portion, and over the second interlayer insulating film 34 after removing the third resist pattern. Then, a photoresist film (not shown) is coated over the transparent conductive film to be exposed and developed. As a result, a fourth resist pattern is formed over the transparent conductive film. The transparent conductive film is etched by means of the fourth resist pattern as a mask. Accordingly, a pixel electrode 26c formed by the transparent conductive film is formed over the second interlayer insulating film 34, and a second gate electrode 26b is formed by the transparent conductive film over the interlayer insulating film 24 in the opening portion 25b to cover the gate electrode 6, and the LDD regions 16, 17. A GOLD structure is formed by the gate electrode 6 and the second gate electrode 26b.

Figure 2D:
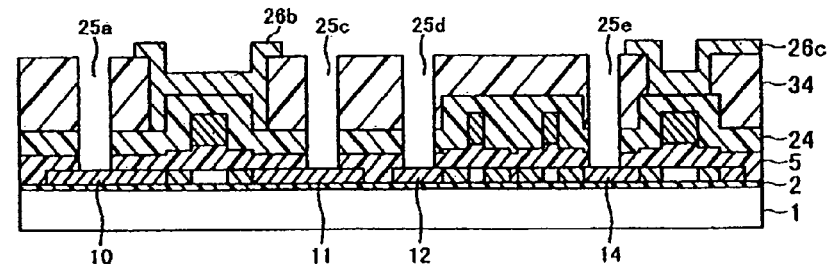

As shown in FIG. 2D, the first interlayer insulating film 24 and the gate insulating film 5 are etched by means of the second gate electrode 26b and the second interlayer insulating film 34 as masks. At this time, the first interlayer insulating film 24 and the gate insulating film 5 may be etched by means of the fourth resist pattern as a mask without removing the fourth resist pattern. Alternatively, the first interlayer insulating film 24 and the gate insulating film 5 may be etched without using the fourth resist pattern as a mask after removing the fourth resist pattern. By this etching treatment, the first interlayer insulating film 24 and the gate insulating film 5 at the bottom of the contact holes 25a, 25c to 25e are etched off, and the source and drain regions 10 to 12, and 14 are exposed by the contact holes 25a, 25c to 25e. Since the pixel electrode 26c is used as an etching mask at this etching treatment, the interlayer insulating film of a light-transmitting portion is not suffered from etching damage, and so the surface of the interlayer insulating film of the light-transmitting portion becomes not rough. Consequently, the deterioration of light-transmitting properties of a pixel can be prevented.

Figure 2E:
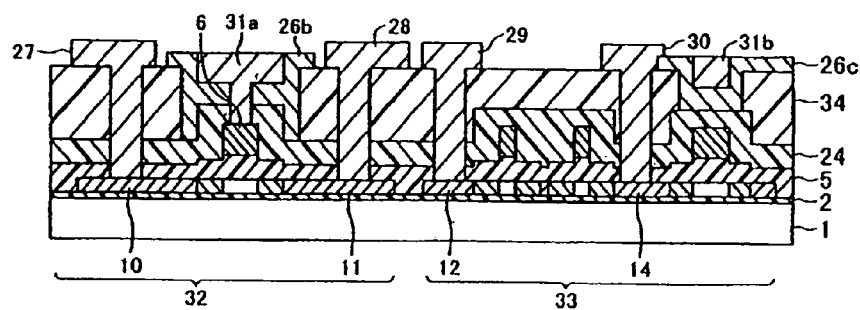

As shown in FIG. 2E, a second conductive film formed by a film made of Al or Al alloys, or a lamination layer including Al or Al alloys over a whole surface including the inside of the contact hole and the surface of the second electrode 26b. Then, a photoresist film (not shown) is coated over the second conductive film to be exposed and developed. As a result, a fifth resist pattern is formed over the second insulating film. And then, the second conductive film is etched by means of the fifth resist pattern as a mask to form wirings 27 to 30 in the contact hole and over the second interlayer insulating film 25. A wiring layer 31a is formed over the second gate electrode 26b. A wiring layer 31b is formed over the pixel electrode 26c. Each the wirings 27 to 30 is electrically connected to the source and drain regions 10 to 12, 14 at the bottom of the contact hole, and the wiring 30 is electrically connected to the pixel electrode 26a. The wiring 31a is electrically connected to the gate electrode 6 by the contact holes provided to the second gate electrode 26b and the first interlayer insulating film 24. That is, the second gate electrode 6 is electrically connected to the gate electrode 6 by the wiring 31a.

Accordingly, a thin film transistor with a GOLD structure is formed at a drive circuit portion 32, and a thin film transistor with a LDD structure is formed at a pixel portion 33 to have a double gate structure.

According to the above described Embodiment 2, an etching treatment for the contact holes 25a, 25c to 25e for forming wirings connected to the source and drain regions 10 to 12, 14 is carried out at twice. The second interlayer insulating film 34 is etched at the first etching, and the first interlayer insulating film 24 and the gate insulating film 5 are etched at the second etching. By the twice etching treatment, the opening portion 25b for forming a GOLD structure can be simultaneously etched at the first etching. Further, since the second etching is carried out after forming the second gate electrode 26b, an etching mask (resist pattern) is not required at the second etching treatment, and so the first interlayer insulating film 24 and the gate insulating film 5 can be etched by means of the second gate electrode 26b and the second interlayer insulating film 25 as masks. As a result, the number of masks can be reduced compared to the case that the contact holes 25a, 25c to 25e are etched at once.

Further, the first interlayer insulating film 24 is formed by a silicon nitride film and the second interlayer insulating film 25 is formed by organic resin in Embodiment 2. In case that the first interlayer insulating film 24 and the second interlayer insulating film 25 can have a high selective etching ratio for the gate insulating film 5 in the process shown in FIG. 2B, and the first interlayer insulating film 24 serves as an etching stopper, the material for the first interlayer insulating film 24 and the second interlayer insulating film 25 can be appropriately changed. For example, a film made of a material having high heat-resisting properties (for example, a silicon oxynitride film or the like) can be used for the interlayer insulating film 24, and a lamination layer including a silicon nitride film and an organic resin film can be used for the second interlayer insulating film 25. In this instance, the oxidization of the gate electrodes 6 to 9 can be prevented by heat activation treatment carried out in the state that the gate electrodes 6 to 9 are covered by the first interlayer insulating film 24.

The wiring layer 31b is left over the pixel electrode 26c in Embodiment 2, however, the wiring layer 31b is not always required to be left.

Embodiment 3

FIGS. 3A to 5C are cross-sectional views for showing a method for manufacturing a semiconductor device according to Embodiment 3 of the present invention.

Figure 3A:
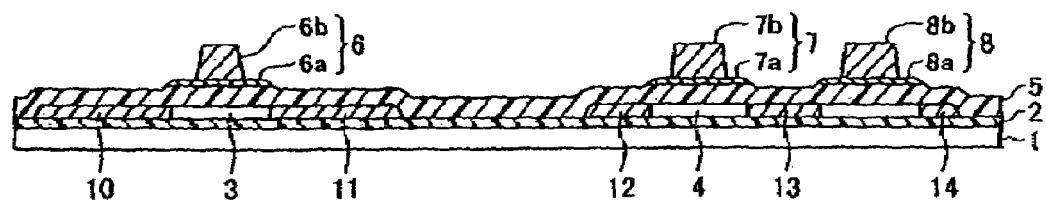
FIGS. 3A to 3C are cross-sectional views for showing a method for manufacturing a semiconductor device according to Embodiment 3 of the present invention.

The process up to the formation of the gate insulating film 5 shown in FIG. 3A is explained in Embodiment 1, and is not further explained hereinafter.

A first conductive film is formed by a tungsten film by sputtering over the gate insulating film 5. Then, a second conductive film is formed by an Al—Si alloy film by sputtering over the first conductive film. Before forming the first conductive film, channel doping may be carried out to control a threshold voltage of a transistor.

A photoresist film (not shown) is coated over the second conductive film to be exposed and developed. As a result, a second resist pattern is formed over the second conductive film. Then, the first and the second conductive films are etched to have taper forms while moving back the second resist pattern. Thereafter, only the second conductive film is selectively etched by using the second resist pattern as a mask. Accordingly, the second conductive films 6b, 7b, and 8b are processed to expose the first conductive films 6a, 7a, and 8a. And then, the second resist pattern is removed.

High concentration impurities, for example phosphorus, for forming source and drain regions are doped to semiconductor layers 3, 4 using the first and the second conductive films 6a, 6b, 6c, 7a, 7b, 8a, and 8b. Accordingly, impurities are introduced to the source and the drain regions 10 to 14 of the semiconductor layers 3, 4 where thin film transistors are formed. Further, the LDD region can be provided to the semiconductor layer below the exposed portion of the first conductive film simultaneously with the above described doping of impurities for forming the source and the drain regions. However, in Embodiment 2, the semiconductor layer below the exposed portion of the first conductive film is hardly doped with impurities since better controllability can be obtained by doping impurities to the LDD regions in another process.

Figure 3B:
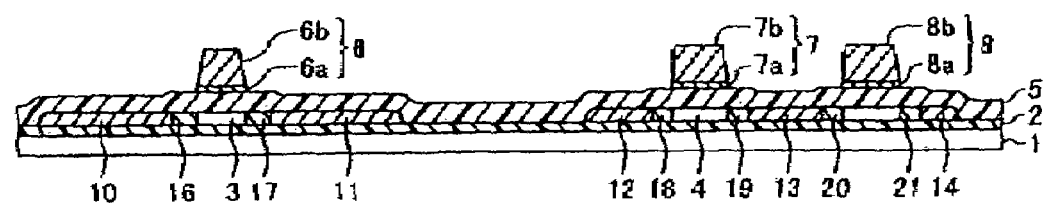

Thereafter, as shown in FIG. 3B, the exposed portions are removed by etching the first conductive films 6a, 7a, and 8a using the second conductive films 6b, 7b, and 8b as masks. As a result, the gate electrodes 6 to 8 are formed by the first and the second conductive films. Then, low concentration impurities such as phosphorus for forming LDD regions are doped to the semiconductor layers 3, 4 using the gate electrodes 6 to 8 as masks. Accordingly, each channel region of thin film transistors has the same size as that of each gate electrodes 6 to 8. LDD regions 16 to 21 are formed in a self-aligning manner corresponding to gate electrodes. Further, the LDD regions may at least at the side of the drain region.

The source and drain regions 10 to 14, and the LDD regions 16 to 21 are activated by laser irradiation. In this embodiment, the second conductive films 6b, 7b, and 8b for forming gate electrodes are formed by Al or Al alloys that has low heat-resisting properties, consequently, the activation of impurities introduced to the semiconductor layer is carried out by laser annealing. However, in case of using materials having high heat-resisting properties for the gate electrode, heat treatment such as furnace annealing, and lamp annealing can be used to activate impurities instead of the laser annealing. Ni is introduced to a high concentration impurity region (source and drain region) by the heat treatment, accordingly, gettering can be carried out.

Figure 3C:
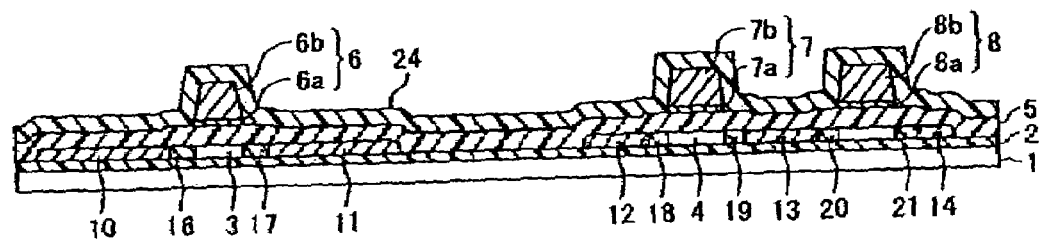

As shown in FIG. 3C, a silicon nitride film (SiN film) is deposited over the whole surface including the gate electrodes 6 to 8 and the gate insulating film 5 to form the first interlayer insulating film 24 containing hydrogen by plasma CVD. Then, heat treatment for hydrogenation is carried out at least 410° C. Accordingly, the crystal defects of the semiconductor layer can be hydrogen-terminated.

Figure 4A:
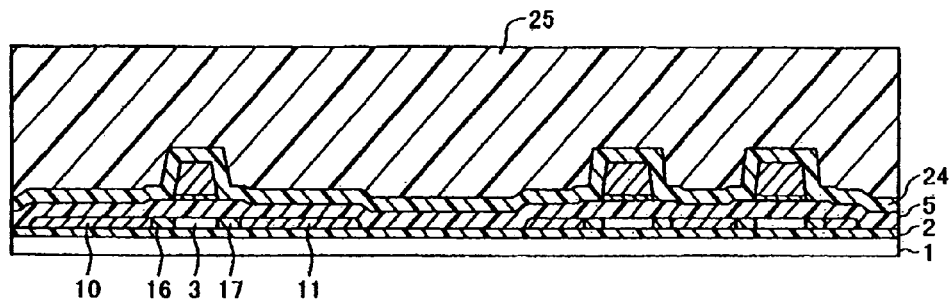
FIGS. 4A to 4C are views for showing a method for manufacturing a semiconductor device according to Embodiment 3 of the present invention, specifically.

Then, a second interlayer insulating film 25 such as organic resin (for example, acrylic) having self planarity properties is formed over the first interlayer insulating film 24 as shown in FIG. 4A.

Figure 4B:
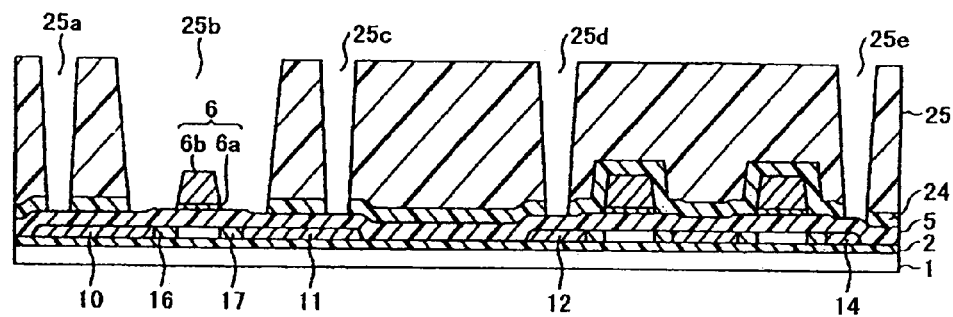

Thereafter, as shown in FIG. 4B, a photoresist film (not shown) is coated over the second interlayer insulating film 25 to be exposed and developed. As a result, a third resist pattern is formed over the second interlayer insulating film 25. Then, the first and the second interlayer insulating films 24, 25 are etched by means of the third resist pattern as a mask. Accordingly, the first and the second interlayer insulating films 24, 25 are provided with contact holes 25a, 25c to 25e located over the source and the drain regions 10 to 12, 14; and an opening portion 25b located over the gate electrode 6 and the LDD regions 16, 17. The opening portion 25b is formed to form a GOLD structure. The gate insulting film 5 is exposed by the contact holes 25a, 25c to 25e, and the opening portions 25b.

Figure 4C:
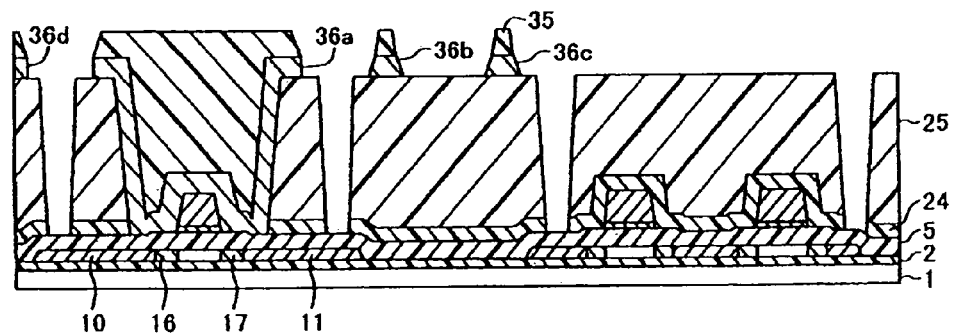

As shown in FIG. 4C, after removing the third resist pattern, a third conductive film formed by a film made of Al or an Al alloy, or a lamination film including a film made of Al or an Al alloy is formed in the contact hole, in the opening portion, and over the second interlayer insulating film 25.

Then, a photoresist film (not shown) is coated over the third conductive film to be exposed and developed. As a result, a fourth resist pattern 35 is formed over the third conductive film. The third conductive film is etched by means of the fourth resist pattern 35 as a mask. Accordingly, a second gate electrode 36a is formed by the third conductive film in the opening portion 25b to cover the gate electrode 6, and the LDD regions 16, 17; and wirings 36b to 36d are formed over the second interlayer insulating film 25. The second gate electrode 36a is in contact with the gate electrode 6. A GOLD structure is formed by the gate electrode 6 and the second gate electrode 36a.

Figure 5A:
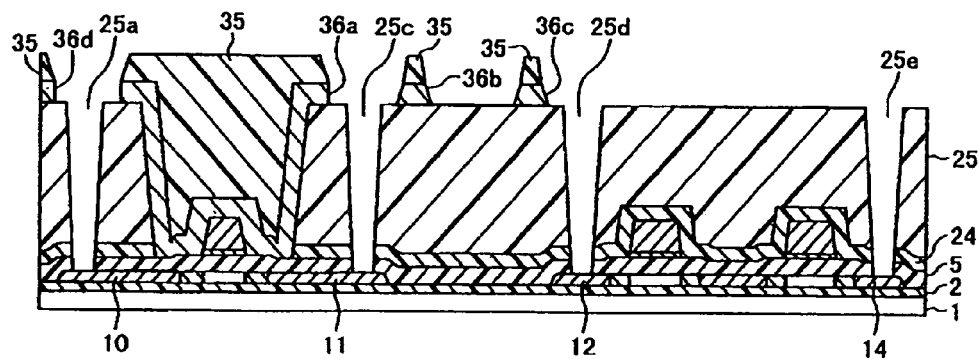
FIGS. 5A to 5C are views for showing a method for manufacturing a semiconductor device according to Embodiment 3 of the present invention, specifically.

Thereafter, as shown in FIG. 5A, a gate insulating film 5 is etched by means of the fourth resist pattern 35 and the second interlayer insulating film 25 as masks. Accordingly, the gate insulating film 5 at the bottom of the contact holes 25a, 25c to 25e is etched off, and the source and the drain regions 10 to 12, 14 are exposed by the contact holes 25a, 25c to 25e.

Figure 5B:
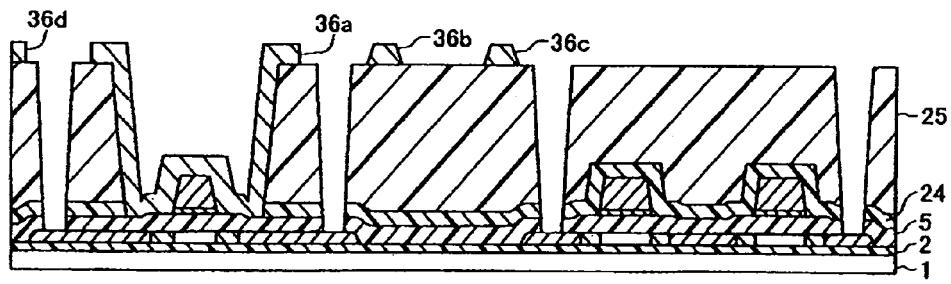
Figure 5C:
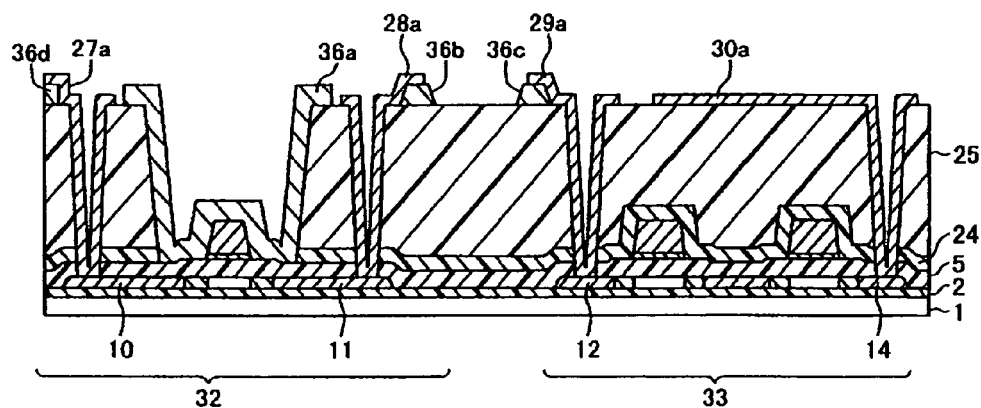

As shown in FIG. 5B, the fourth resist pattern 35 is removed. As a modified example of the above described etching off process, the gate insulating film 5 may be etched off without using the fourth resist pattern as a mask after removing the fourth resist pattern. Thereafter, as shown in FIG. 5C, a transparent conductive film such as ITO is formed over a whole surface including the inside of the contact holes and the surface of the second gate electrode 36a. A photoresist film (not shown) is coated over the transparent conductive film to be exposed and developed. As a result, a fifth resist pattern is formed over the transparent conductive film. Then, the transparent conductive film is etched by means of the fifth resist pattern as a mask. Accordingly, source and drain electrodes 27a to 30a formed by the transparent conductive film are formed in the contact holes and over the second interlayer insulating film 25; and a pixel electrode formed by the transparent conductive film is formed over the second interlayer insulating film 25. Each the source and the drain electrodes 27a to 30a is electrically connected to the source and the drain electrodes 10 to 12, 14 at the bottom of the contact holes, and each the source and the drain electrodes 27a to 29a is electrically connected to wirings 36d, 36b, and 36c.

A thin film transistor with a GOLD structure is thus formed at the drive circuit portion 32. A thin film transistor with a LDD structure is formed to have a double gate structure is formed at the pixel portion 33.

According to Embodiment 3, an etching treatment for the contact holes 25a, 25c to 25e that form source and drain electrodes for connecting to the source and drain regions 10 to 12, 14 is carried out at twice. The second interlayer insulating films 24, 25 are etched at the first etching, and the gate insulating film 5 is etched at the second etching. By the twice etching treatment, the opening portion 25b for forming a GOLD structure can be simultaneously etched at the first etching. Further, since the second etching is carried out after forming the second gate electrode 36a, an etching mask (resist pattern) is not required at the second etching treatment, and so the gate insulating film 5 can be etched by means of the second gate electrode 36a and the second interlayer insulating film 25 as masks. As a result, the number of masks can be reduced compared to the case that the contact holes 25a, 25c to 25e are etched at once.

The thin film transistor with a LDD structure formed at the pixel electrode 33 is formed to have a double gate structure in Embodiment 3. However, the thin film transistor is not limited to a double gate structure, it can be formed to have a single gate structure. The pixel electrode, the source electrode, and the drain electrode are formed by transparent conductive films in Embodiment 3. The transparent conductive film is preferably used in case of transparent liquid crystal. In case of reflective liquid crystal, a conductive film having high reflectivity (for example, Al or the like) is preferably used.

The opening portion 25b is formed to be located over the gate electrode 6 and the LDD regions 16, 17 in Embodiment 3. However, the opening portion 25b may be located over at least the LDD region. It is not limited that the opening portion 25b is located over the gate electrode 6. In Embodiment 3, the first interlayer insulating film 24 is formed by a silicon nitride film, and the second interlayer insulating film 25 is formed by organic resin. In case that the first and the second interlayer insulating films 24 and 25 can have a high selective etching ratio for the gate insulating film 5 in the process shown in FIG. 4B, and the gate insulating film 5 serves as an etching stopper, the material for the first and the second interlayer insulating films 24 and 25 can be appropriately changed.

In Embodiment 3, the edge portion of the second gate electrode 36a with a GOLD structure is extended to the surface of the second interlayer insulating film 25. However, in case that the second gate electrode 36a is located over the LDD region, the edge portion of the second gate electrode 36a is not required to be extended to the surface of the second interlayer insulating film 25.

In Embodiment 3, the thin film transistor with a GOLD structure is formed at the drive circuit portion 32, however, both the thin film transistor with a GOLD structure and the thin film transistor with a LDD structure can be formed at the drive circuit portion 32.

In Embodiment 3, the method for manufacturing a thin film transistor of single conductivity type (for example, an N-channel type) over the glass substrate 1 is explained. However, a thin film transistor of a P-channel type can also be manufactured to provide a CMOS over a glass substrate. In this instance, one more mask for forming the impurity region of the P-channel type thin film transistor is required.

Embodiment 4

Figure 6A:
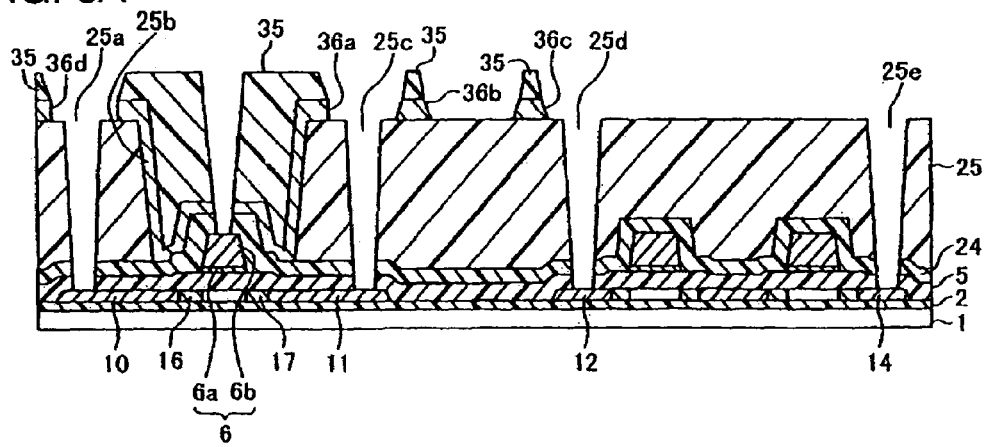
FIGS. 6A to 6C are cross-sectional views for showing a method for manufacturing a semiconductor device according to Embodiment 4 of the present invention.
Figure 6B:
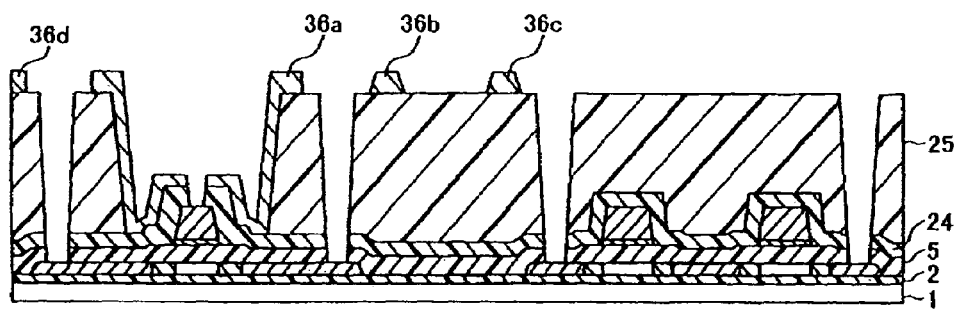
Figure 6C:
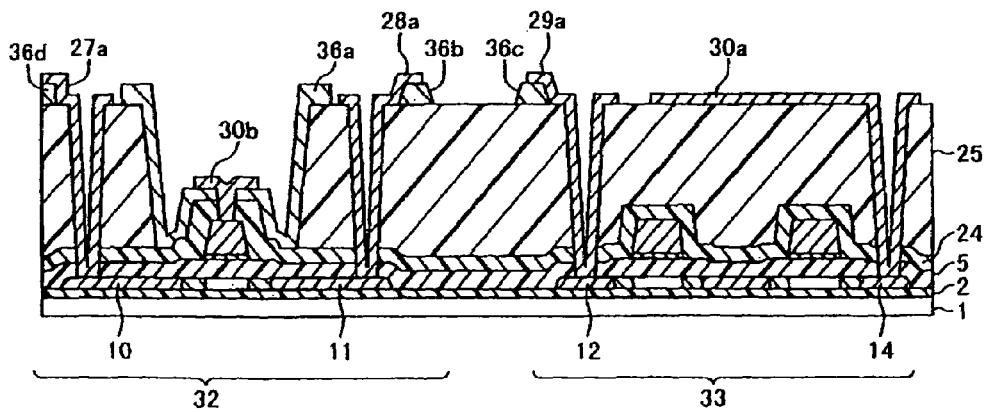

FIGS. 6A to 6C are cross-sectional views for showing a method for manufacturing a semiconductor device according to Embodiment 4 of the present invention. Through FIGS. 6A to 6C, like components are denoted by like numerals as of FIGS. 5A to 5C and will not be further explained hereinafter.

The process shown in FIGS. 3A to 3C, and FIG. 4A in Embodiment 3 is carried out in Embodiment 4, and is not further explained in Embodiment 4.

As shown in FIG. 6A, a photoresist film (not shown) is coated over the second interlayer insulating film 25 to be exposed and developed. As a result, a third resist pattern is formed over the second interlayer insulating film 25. Then, the second interlayer insulating film 25 is etched by means of the third resist pattern as a mask. Accordingly, the second interlayer insulating film 25 is provided with contact holes 25a, 25c to 25e located over the source and the drain regions 10 to 12, 14; an opening portion 25b located over the gate electrode 6 and the LDD regions 16, 17; and an opening portion 25f located over the gate electrode 9. The opening portion 25b is formed to form a GOLD structure. The first interlayer insulating film 24 is exposed by the contact holes 25a, 25c to 25e, and the opening portions 25b.

After removing a third resist pattern, a third conductive film is formed by a film made of Al or Al alloys, or a lamination layer including a film made of Al or Al alloys over a whole surface including the inside of the contact holes, the inside of the opening portions, and the surface of the second interlayer insulating film 25. Then, a photoresist film is coated over the third conductive film to be exposed and developed. As a result, a fourth resist pattern 35 is formed over the third conductive film. And then, the third conductive film is etched by means of the fourth resist pattern 35 as a mask, accordingly, a second electrode 36a is formed by the third conductive film in the opening portion 25b to cover the gate electrode 6 and the LDD regions 16, 17. The second gate electrode 36a is formed over the gate electrode 6 via the first interlayer insulating film 24. A GOLD structure is formed by the gate electrode 6 and the second gate electrode 36a.

The first interlayer insulating film 24 and the gate insulating film 5 are etched by means of the fourth resist pattern 35 and the second interlayer insulating film 25 as masks. Accordingly, the first interlayer insulating film 24 and the gate insulating film 5 at the bottom of the contact holes 25a, 25c to 25e are etched off, and the source and the drain regions 10 to 12, 14 are exposed by the contact holes 25a, 25c to 25e. Simultaneously, the first interlayer insulating film 24 over the gate electrode 6 is etched off, then, a part of the top surface of the gate electrode 6 is exposed.

As shown in FIG. 6B, the fourth resist pattern 35 is removed. As a modified example of the above described etching off process, the first interlayer insulating film 24 and the gate insulating film 5 may be etched off without using the fourth resist pattern as a mask after removing the fourth resist pattern.

Thereafter, as shown in FIG. 6C, a transparent conductive film such as ITO is formed over a whole surface including the inside of the contact holes and the second gate electrode 36a. A photoresist film (not shown) is coated over the transparent conductive film to be exposed and developed. As a result, a fifth resist pattern is formed over the transparent conductive film. Then, the transparent conductive film is etched by means of the fifth resist pattern as a mask. Accordingly, source and drain electrodes 27a to 30a are formed by the transparent conductive film in the contact holes and over the second interlayer insulating film 25; an electrode layer 30b is formed over the second electrode 36a; and a pixel electrode is formed by the transparent conductive film over the second interlayer insulating film 25. Each the source and the drain electrodes 27a to 30a is electrically connected to the source and the drain electrodes 10 to 12, 14 at the bottom of the contact holes, and each the source and the drain electrodes 27a to 29a is electrically connected to wirings 36d, 36b, and 36c. The electrode layer 30b is electrically connected to the gate electrode 6 by contact holes provided to the second gate electrode 36e and the first interlayer insulating film 24. Therefore, the second gate electrode 6 is electrically connected to the second gate electrode 6 by the electrode layer 30b.

Thus, a thin film transistor with a GLOD structure is formed at the drive circuit portion 32, and a thin film transistor with a LDD structure is formed to have a double gate structure at the pixel portion 33.

According to Embodiment 4, an etching treatment for the contact holes 25a, 25c to 25e that form source and drain electrodes for connecting to the source and drain regions 10 to 12, 14 is carried out at twice. The second interlayer insulating film 25 is etched at the first etching, and the first interlayer insulating film 24 and the gate insulating film 5 are etched at the second etching. By the twice etching treatment, the opening portion 25b for forming a GOLD structure can be etched simultaneously with the first etching. Further, since the second etching is carried out after forming the second gate electrode 36a, an etching mask (resist pattern) is not required at the second etching treatment, and so the first interlayer insulating film 24 and the gate insulating film 5 can be etched by means of the second gate electrode 36a and the second interlayer insulating film 25 as masks. As a result, the number of masks can be reduced compared to the case that the contact holes 25a, 25c to 25e are etched at once.

The first interlayer insulating film 24 is formed by a silicon nitride film and the second interlayer insulating film 25 is formed by organic resin in Embodiment 4. In case that the first and the second interlayer insulating films 24 and 25 can have a high selective etching ratio for the gate insulating film 5, and the first interlayer insulating film 24 serves as an etching stopper, the material for the first and the second interlayer insulating films 24 and 25 can be appropriately changed.

The present invention is not limited to the above described Embodiment. The present invention can be practiced with various changes and modifications without departing from the scope of the present invention. For example, the structure of the TFT is not limited to the above described Embodiment, the TFT can be formed into an inversely staggered TFT as shown in FIG. 7.

Figure 7:
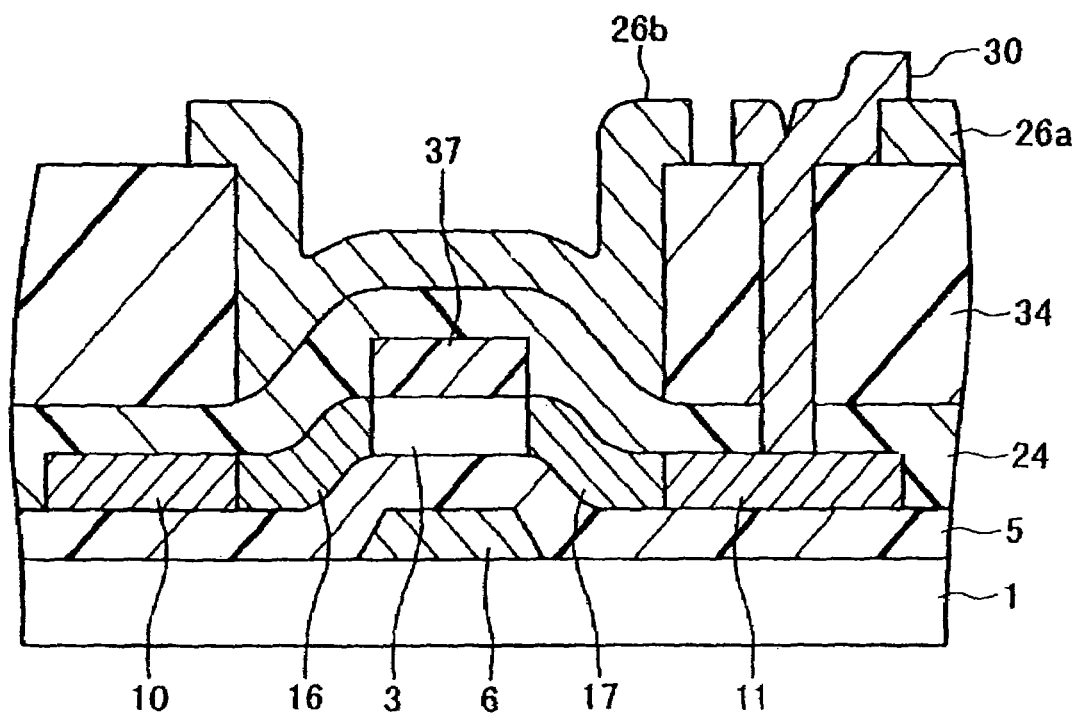
FIG. 7 is a cross-sectional view for showing an inversely staggered TFT according to a modified example of the present invention.

The inversely staggered TFT shown in FIG. 7 comprises a glass substrate 1. A gate electrode 6 is formed over the glass substrate 1. A gate insulating film 5 is formed over a whole surface including the gate electrode 6. An island like semiconductor layer 3 is formed over the gate insulating film 5. A source region 10, a drain region 11, and LDD regions 16, 17 are formed over the semiconductor layer 3. A $SiO_2$ film 37 is formed over the island like semiconductor layer 3 so as to be located over the gate electrode 6. A first interlayer insulating film 24 is formed over a whole surface including the $SiO_2$ film 37. A second interlayer insulating film 34 is formed over the first interlayer insulating film 34. An opening portion is provided to the second interlayer insulating film 34 so as to be located over the gate electrode 6. A contact hole located over a drain region 11 is provided to the first and the second interlayer insulating films 24, 34. A pixel electrode 26a formed by a conductive film such as ITO over the second interlayer insulating film 34. A second gate electrode 26b formed by a conductive film such as ITO is formed inside the opening portion and over the second interlayer insulating film 34. A wiring 30 is formed in the contact hole and over the second interlayer insulating film 34. The wiring 30 is electrically connected to the drain region 11 and the pixel electrode 26a.

What is claimed is:

1. A method for manufacturing a semiconductor device comprising the steps of:
    forming a semiconductor layer having a source region, a drain region, and a LDD region; a gate insulating film; and a first gate electrode;
    forming an interlayer insulating film over the first gate electrode and the gate insulating film;
    forming a first opening portion in the interlayer insulating film so as to be located over each of the source region and the drain region; and a second opening portion in the interlayer insulating film so as to be located over the LDD region and the first gate electrode;
    forming a second gate electrode by a conductive film in the second opening portion so as to contact the first gate electrode and cover the LDD region; and a pixel electrode by the conductive film over the interlayer insulating film;
    removing the gate insulating film in the first opening portion; and
    forming a wiring connected to each of the source region and the drain region in the first opening portion and over the interlayer insulating film.

2. A method for manufacturing a semiconductor device comprising the steps of:
    forming a semiconductor layer having a source region, a drain region, and a LDD region; a gate insulating film; and a first gate electrode;
    forming an interlayer insulating film over the first gate electrode and the gate insulating film;
    forming a first opening portion in the interlayer insulating film so as to be located over each of the source region and the drain region; and a second opening portion in the interlayer insulating film so as to be located over the LDD region and the first gate electrode;
    forming a second gate electrode by a first conductive film in the second opening portion so as to contact the first gate electrode and cover the LDD region; and a wiring by the first conductive film over the interlayer insulating film;
    removing the gate insulating film in the first opening portion; and
    forming a source electrode and a drain electrode by a second conductive film to connect to each of the source region, the drain region, and the wiring in the first opening portion and over the interlayer insulating film; and a pixel electrode by the second conductive film over the interlayer insulating film.

3. A method for manufacturing a semiconductor device comprising the steps of:
    forming a semiconductor layer having a source region, a drain region, and a LDD region; a gate insulating film; and a first gate electrode;
    forming a first interlayer insulating film over the first gate electrode and the gate insulating film;
    forming a second interlayer insulating film over the first interlayer insulating film;
    forming a first opening portion in the first interlayer insulating film and the second interlayer insulating film so as to be located over each of the source region and the drain region; and a second opening portion in the first interlayer insulating film and the second interlayer insulating film so as to be located over the LDD region and the first gate electrode;
    forming a second gate electrode by a conductive film in the second opening portion so as to contact the first gate electrode and cover the LDD region; and a pixel electrode by the conductive film over the second interlayer insulating film;
    removing the gate insulating film in the first opening portion; and
    forming a wiring connected to each of the source region and the drain region in the first opening portion and over the second interlayer insulating film.

4. A method for manufacturing a semiconductor device comprising the steps of:
    forming a semiconductor layer having a source region, a drain region, and a LDD region; a gate insulating film; and a first gate electrode;
    forming a first interlayer insulating film over the first gate electrode and the gate insulating film;
    forming a second interlayer insulating film over the first interlayer insulating film;
    forming a first opening portion in the first interlayer insulating film and the second interlayer insulating film so as to be located over each of the source region and the drain region; and a second opening portion in the first interlayer insulating film and the second interlayer insulating film so as to be located over the LDD region and the first gate electrode;

forming a second gate electrode by a first conductive film in the second opening portion so as to contact the first gate electrode and cover the LDD region; and a wiring by the first conductive film over the second interlayer insulating film;

removing the gate insulating film in the first opening portion; and forming a source electrode and a drain electrode by a second conductive film to connect to each of the source region, the drain region, and the wiring in the first opening portion and over the second interlayer insulating film; and a pixel electrode by the second conductive film over the second interlayer insulating film.

5. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the second interlayer insulating film so as to be located over each of the source region and the drain region; and a second opening portion in the second interlayer insulating film so as to be located over the LDD region and the first gate electrode;

forming a second gate electrode by a conductive film in the second opening portion so as to cover the first gate electrode and the LDD region; and a pixel electrode by the conductive film over the second interlayer insulating film;

removing the first interlayer insulating film and the gate insulating film in the first opening portion; and forming a third opening portion in the second gate electrode and the first interlayer insulating film;

forming a wiring connected to each of the source region and the drain region in the first opening portion and over the second interlayer insulating film; and a wiring layer on the second gate electrode, connected to the first gate electrode through the third opening portion.

6. A method for manufacturing a semiconductor device according to claim 5, wherein a capacitor portion including a first capacitor electrode and a second capacitor electrode is formed by forming a third opening portion in the second interlayer insulating film when the second opening portion is formed; by forming the first capacitor electrode by the conductive film in the third opening portion when the pixel electrode is formed; and by forming a second capacitor electrode in the third opening portion when the wiring is formed.

7. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the second interlayer insulating film so as to be located over each of the source region and the drain region; and a second opening portion in the second interlayer insulating film so as to be located over the LDD region and the first gate electrode;

forming a second gate electrode by a first conductive film in the second opening portion so as to cover the first gate electrode and the LDD region; and a wiring by the first conductive film over the second interlayer insulating film;

removing the first interlayer insulating film and the gate insulating film in the first opening portion;

forming a third opening portion in the second gate electrode and the first interlayer insulating film;

forming a source electrode and a drain electrode by a second conductive film to connect to each of the source region, the drain region, and the wiring in the first opening portion and over the second interlayer insulating film; an electrode layer on the second gate electrode, connected to the first gate electrode through the third opening portion, and a pixel electrode by the second conductive film over the second interlayer insulating film.

8. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the first interlayer insulating film and the second interlayer insulating film so as to be located over the source region and the drain region; and a second opening portion in the first interlayer insulating film and the second interlayer insulating film so as to be located over the LDD region and the first gate electrode, by etching the first interlayer insulating film and the second interlayer insulating film;

forming a first conductive film in the second opening portion and over the second interlayer insulating film;

forming a second gate electrode by the first conductive film in the opening portion so as to contact the first gate electrode and cover the LDD region; and a pixel electrode formed by the first conductive film over the second interlayer insulating film, by etching the first conductive film;

etching off the gate insulating film in the first opening portion;

depositing a second conductive film in the first opening portion and over the second interlayer insulating film; and forming a wiring connected to each of the source region and the drain region in the first opening portion and over the second interlayer insulating film by etching the second conductive film.

9. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region and the first gate electrode, by etching the first interlayer insulating film and the second interlayer insulating film;

forming a first conductive film in the second opening portion and over the second interlayer insulating film;

forming a second gate electrode by the first conductive film in the second opening portion so as to contact the first gate electrode and cover the LDD region; and a wiring formed by the first conductive film over the second interlayer insulating film, by etching the first conductive film;

etching off the gate insulating film in the first opening portion;

depositing a second conductive film in the first opening portion and over the second interlayer insulating film; and forming a source electrode and a drain electrode by a second conductive film to connect to each of the source region, the drain region, and the wiring in the first opening portion and over the second interlayer insulating film; and a pixel electrode by the second conductive film over the second interlayer insulating film, by etching the second conductive film.

10. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region and the first gate electrode, by etching the second interlayer insulating film;

forming a first conductive film in the second opening portion and over the second interlayer insulating film;

forming a second gate electrode by the first conductive film in the second opening portion so as to cover the first gate electrode and the LDD region; and a pixel electrode formed by the first conductive film over the second interlayer insulating film, by etching the first conductive film;

etching off the first interlayer insulating film and the gate insulating film in the first opening portion;

forming a third opening portion in the second gate electrode and the first interlayer insulating film;

depositing a second conductive film in the first opening portion and the third opening portion and over the second interlayer insulating film; and forming a wiring connected to each of the source region and the drain region in the first opening portion and over the second interlayer insulating film; and wiring layer on the second gate electrode, connected to the first gate electrode through the third opening portion, by etching the second conductive film.

11. A method for manufacturing a semiconductor device comprising the steps of:

forming a semiconductor layer having a source region, a drain region, and a LDD region; a gate insulating film; and a first gate electrode;

forming a first interlayer insulating film over the first gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region and the first gate electrode, by etching the second interlayer insulating film;

forming a first conductive film in the second opening portion and over the second interlayer insulating film;

forming a second gate electrode by the first conductive film in the second opening portion so as to cover the first gate electrode and the LDD region; and a wiring formed by the first conductive film over the second interlayer insulating film, by etching the first conductive film;

etching off the first interlayer insulating film and the gate insulating film in the first opening portion;

forming a third opening portion in the second gate electrode and the first interlayer insulting film;

depositing a second conductive film in the first opening portion and the third opening portion and over the second interlayer insulating film; and forming a source electrode and a drain electrode by a second conductive film to connect to each of the source region, the drain region, and the wiring in the first opening portion and over the second interlayer insulating film; an electrode layer on the second gate electrode, connected to the first gate electrode through the third opening portion; and a pixel electrode by the second conductive film over the second interlayer insulating film, by etching the second conductive film.

12. A method for manufacturing a semiconductor device comprising the steps of:

forming a first semiconductor layer and a second semiconductor layer over a substrate;

forming a gate insulating film over the first semiconductor layer, the second semiconductor layer, and the substrate;

introducing an impurity into a source region and a drain region of each of the first semiconductor layer and the second semiconductor layer;

forming a first gate electrode over each of the first semiconductor layer and the second semiconductor layer via the gate insulating film;

introducing an impurity into a LDD region of each of the first semiconductor layer and the second semiconductor layer;

forming a first interlayer insulating film over the first gate electrode and the gate insulating film;

forming a second interlayer insulating film over the first interlayer insulating film;

forming a first opening portion in the first interlayer insulating film and the second interlayer insulating film so as to be located over each of the source region and the drain region; and a second opening portion in the first interlayer insulating film and the second interlayer insulating film so as to be located over the LDD region and the first gate electrode of the first semiconductor layer, by etching the first interlayer insulating film and the second interlayer insulating film;
forming a first conductive film in the second opening portion and over the second interlayer insulating film;
forming a second gate electrode by the first conductive film in the second opening portion so as to contact the first gate electrode and cover the LDD region; and a pixel electrode formed by the first conductive film over the second interlayer insulating film, by etching the first conductive film;
etching off the gate insulating film in the first opening portion;
depositing a second conductive film in the first opening portion and over the second interlayer insulating film; and
forming a wiring connected to each of the source region and the drain region in the first opening portion and over the second interlayer insulating film by etching the second conductive film.

13. A method for manufacturing a semiconductor device according to claim 1, wherein the wiring is also formed over the second gate electrode.

14. A method for manufacturing a semiconductor device according to claim 3, wherein the wiring is also formed over the second gate electrode.

15. A method for manufacturing a semiconductor device according to claim 8, wherein the wiring is also formed over the second gate electrode.

16. A method for manufacturing a semiconductor device according to claim 12, wherein the wiring is also formed over the second gate electrode.

17. A method for manufacturing a semiconductor device according to claim 8, wherein the gate insulating film in the first opening portion is etched off by using as an etching mask at least one selected from the group consisting of resist which is used as an etching mask for forming the second gate electrode; the second gate electrode; the pixel electrode; and the second interlayer insulating film.

18. A method for manufacturing a semiconductor device according to claim 12, wherein the gate insulating film in the first opening portion is etched off by using as an etching mask at least one selected from the group consisting of resist which is used as an etching mask for forming the second gate electrode; the second gate electrode; the pixel electrode; and the second interlayer insulating film.

19. A method for manufacturing a semiconductor device comprising the steps of:
forming a first semiconductor layer and a second semiconductor layer over a substrate;
forming a gate insulating film over the first semiconductor layer, the second semiconductor layer, and the substrate;
introducing an impurity into a source region and a drain region of each of the first semiconductor layer and the second semiconductor layer;
forming a first gate electrode over each of the first semiconductor layer and the second semiconductor layer via the gate insulating film;
introducing an impurity into a LDD region of the first semiconductor layer and the second semiconductor layer;
forming a first interlayer insulating film over the first gate electrode and the gate insulating film;
forming a second interlayer insulating film over the first interlayer insulating film;
forming a first opening portion in the first interlayer insulating film and the second interlayer insulating film so as to be located over the source region and the drain region; and a second opening portion in the first interlayer insulating film and the second interlayer insulating film so as to be located over the LDD region and the first gate electrode of the first semiconductor layer, by etching the first interlayer insulating film and the second interlayer insulating film;
forming a first conductive film in the second opening portion and over the second interlayer insulating film;
forming a second gate electrode by the first conductive film in the second opening portion so as to contact the first gate electrode and cover the LDD region; and a wiring formed by the first conductive film over the second interlayer insulating film, by etching the first conductive film;
etching off the gate insulating film in the first opening portion;
depositing a second conductive film in the first opening portion and over the second interlayer insulating film; and
forming a source electrode and a drain electrode to connect to each of the source region, the drain region, and the wiring in the first opening portion and over the second interlayer insulating film; and a pixel electrode by the second conductive film over the second interlayer insulating film, by etching the second conductive film.

20. A method for manufacturing a semiconductor device according to claim 9, wherein the gate insulating film in the first opening portion is etched off by using as an etching mask at least one selected from the group consisting of resist which is used as an etching mask for forming the second gate electrode; the second gate electrode; the wiring; and the second interlayer insulating film.

21. A method for manufacturing a semiconductor device according to claim 19, wherein the gate insulating film in the first opening portion is etched off by using as an etching mask at least one selected from the group consisting of resist which is used as an etching mask for forming the second gate electrode; the second gate electrode; the wiring; and the second interlayer insulating film.

22. A method for manufacturing a semiconductor device comprising the steps of:
forming a first semiconductor layer and a second semiconductor layer over a substrate;
forming a gate insulating film over the first semiconductor layer, the second semiconductor layer, and the substrate;
introducing an impurity into a source region and a drain region of each of the first semiconductor layer and the second semiconductor layer;
forming a first gate electrode over each of the first semiconductor layer and the second semiconductor layer via the gate insulating film;
introducing an impurity into a LDD region of each of the first semiconductor layer and the second semiconductor layer;
forming a first interlayer insulating film over the first gate electrode and the gate insulating film;
forming a second interlayer insulating film over the first interlayer insulating film;
forming a first opening portion in the second interlayer insulating film so as to be located over the source region and the drain region; and a second opening portion in the second interlayer insulating film so as to be located over the LDD region and the first gate electrode of the first semiconductor layer, by etching the second interlayer insulating film;

forming a first conductive film in the second opening portion and over the second interlayer insulating film;

forming a second gate electrode by the first conductive film in the second opening portion so as to cover the first gate electrode and the LDD region; and a pixel electrode formed by the first conductive film over the second interlayer insulating film, by etching the first conductive film;

etching off the first interlayer insulating film and the gate insulating film in the first opening portion;

forming a third opening portion in the second gate electrode and the first interlayer insulating film;

depositing a second conductive film in the first opening portion and the third opening portion and over the second interlayer insulating film; and forming a wiring connected to each of the source region and the drain region in the first opening portion and over the second interlayer insulating film; and a wiring layer on the second gate electrode, connected to the first gate electrode through the third opening portion, by etching the second conductive film.

23. A method for manufacturing a semiconductor device according to claim 10, wherein the first interlayer insulating film and the gate insulating film in the first opening portion is etched off by using as an etching mask at least one selected from the group consisting of resist which is used as an etching mask for forming the second gate electrode; the second gate electrode; the pixel electrode; and the second interlayer insulating film.

24. A method for manufacturing a semiconductor device according to claim 22, wherein the first interlayer insulating film and the gate insulating film in the first opening portion is etched off by using as an etching mask at least one selected from the group consisting of resist which is used as an etching mask for forming the second gate electrode; the second gate electrode; the pixel electrode; and the second interlayer insulating film.

25. A method for manufacturing a semiconductor device according to claim 5, wherein the first interlayer insulating film is formed by a film made of a material having heat-resisting properties, and heat activated.

26. A method for manufacturing a semiconductor device according to claim 10, wherein the first interlayer insulating film is formed by a film made of a material having heat-resisting properties, and heat activated.

27. A method for manufacturing a semiconductor device according to claim 22, wherein the first interlayer insulating film is formed by a film made of a material having heat-resisting properties, and heat activated.

28. A method for manufacturing a semiconductor device comprising the steps of:

forming a first semiconductor layer and a second semiconductor layer over a substrate;

forming a gate insulating film over the first semiconductor layer, the second semiconductor layer, and the substrate;

introducing an impurity into a source region and a drain region of each of the first semiconductor layer and the second semiconductor layer;

forming a first gate electrode over each of the first semiconductor layer and the second semiconductor layer via the gate insulating film;

introducing an impurity into a LDD region of the first semiconductor layer and the second semiconductor layer;

forming a first interlayer insulating film over the first gate electrode and the gate insulating film;

forming a second interlayer insulating film over the first interlayer insulating film;

forming a first opening portion in the second interlayer insulating film so as to be located over the source region and the drain region; and a second opening portion in the second interlayer insulating film so as to be located over the LDD region and the first gate electrode of the first semiconductor layer, by etching the second interlayer insulating film;

forming a first conductive film in the second opening portion and over the second interlayer insulating film;

forming a second gate electrode by the first conductive film in the second opening portion so as to cover the first gate electrode and the LDD region; and a wiring formed by the first conductive film over the second interlayer insulating film, by etching the first conductive film;

etching off the first interlayer insulating film and the gate insulating film in the first opening portion;

forming a third opening portion in the second gate electrode and the first interlayer insulating film;

depositing a second conductive film in the first opening portion and the third opening portion and over the second interlayer insulating film; and forming a source electrode and a drain electrode by a second conductive film to connect to each of the source region, the drain region, and the wiring in the first opening portion and over the second interlayer insulating film; an electrode layer on the second gate electrode, connected to the first gate electrode through the third opening portion; and a pixel electrode by the second conductive film over the second interlayer insulating film, by etching the second conductive film.

29. A method for manufacturing a semiconductor device according to claim 10, wherein the first interlayer insulating film and the gate insulating film in the first opening portion is etched off by using as an etching mask at least one selected from the group consisting of resist which is used as an etching mask for forming the second gate electrode; the second gate electrode; the wiring; and the second interlayer insulating film.

30. A method for manufacturing a semiconductor device according to claim 22, wherein the first interlayer insulating film and the gate insulating film in the first opening portion is etched off by using as an etching mask at least one selected from the group consisting of resist which is used as an etching mask for forming the second gate electrode; the second gate electrode; the wiring; and the second interlayer insulating film.

31. A method for manufacturing a semiconductor device according to claim 8, wherein after an impurity is introduced into the source region, the drain region, and the LDD region; the source region, the drain region, and the LDD region are activated by laser irradiation or heat treatment.

32. A method for manufacturing a semiconductor device according to claim 9, wherein after an impurity is introduced into the source region, the drain region, and the LDD region; the source region, the drain region, and the LDD region are activated by laser irradiation or heat treatment.

33. A method for manufacturing a semiconductor device according to claim 10, wherein after an impurity is introduced into the source region, the drain region, and the LDD region; the source region, the drain region, and the LDD region are activated by laser irradiation or heat treatment.

34. A method for manufacturing a semiconductor device according to claim 11, wherein after an impurity is introduced into the source region, the drain region, and the LDD region; the source region, the drain region, and the LDD region are activated by laser irradiation or heat treatment.

35. A method for manufacturing a semiconductor device according to claim 12, wherein after an impurity is introduced into the source region, the drain region, and the LDD region; the source region, the drain region, and the LDD region are activated by laser irradiation or heat treatment.

36. A method for manufacturing a semiconductor device according to claim 19, wherein after an impurity is introduced into the source region, the drain region, and the LDD region; the source region, the drain region, and the LDD region are activated by laser irradiation or heat treatment.

37. A method for manufacturing a semiconductor device according to claim 22, wherein after an impurity is introduced into the source region, the drain region, and the LDD region; the source region, the drain region, and the LDD region are activated by laser irradiation or heat treatment.

38. A method for manufacturing a semiconductor device according to claim 28, wherein after an impurity is introduced into the source region, the drain region, and the LDD region; the source region, the drain region, and the LDD region are activated by laser irradiation or heat treatment.

39. A method for manufacturing a semiconductor device according to claim 1, wherein the gate electrode is formed by a film made of aluminum or an alloy of aluminum, or a lamination film including a film made of aluminum or an alloy of aluminum.

40. A method for manufacturing a semiconductor device according to claim 2, wherein the gate electrode is formed by a film made of aluminum or an alloy of aluminum, or a lamination film including a film made of aluminum or an alloy of aluminum.

41. A method for manufacturing a semiconductor device according to claim 3, wherein the gate electrode is formed by a film made of aluminum or an alloy of aluminum, or a lamination film including a film made of aluminum or an alloy of aluminum.

42. A method for manufacturing a semiconductor device according to claim 4, wherein the gate electrode is formed by a film made of aluminum or an alloy of aluminum, or a lamination film including a film made of aluminum or an alloy of aluminum.

43. A method for manufacturing a semiconductor device according to claim 5, wherein the gate electrode is formed by a film made of aluminum or an alloy of aluminum, or a lamination film including a film made of aluminum or an alloy of aluminum.

44. A method for manufacturing a semiconductor device according to claim 6, wherein the gate electrode is formed by a film made of aluminum or an alloy of aluminum, or a lamination film including a film made of aluminum or an alloy of aluminum.

45. A method for manufacturing a semiconductor device according to claim 7, wherein the gate electrode is formed by a film made of aluminum or an alloy of aluminum, or a lamination film including a film made of aluminum or an alloy of aluminum.

46. A method for manufacturing a semiconductor device according to claim 8, wherein the gate electrode is formed by a film made of aluminum or an alloy of aluminum, or a lamination film including a film made of aluminum or an alloy of aluminum.

47. A method for manufacturing a semiconductor device according to claim 9, wherein the gate electrode is formed by a film made of aluminum or an alloy of aluminum, or a lamination film including a film made of aluminum or an alloy of aluminum.

48. A method for manufacturing a semiconductor device according to claim 10, wherein the gate electrode is formed by a film made of aluminum or an alloy of aluminum, or a lamination film including a film made of aluminum or an alloy of aluminum.

49. A method for manufacturing a semiconductor device according to claim 11, wherein the gate electrode is formed by a film made of aluminum or an alloy of aluminum, or a lamination film including a film made of aluminum or an alloy of aluminum.

50. A method for manufacturing a semiconductor device according to claim 12, wherein the gate electrode is formed by a film made of aluminum or an alloy of aluminum, or a lamination film including a film made of aluminum or an alloy of aluminum.

51. A method for manufacturing a semiconductor device according to claim 19, wherein the gate electrode is formed by a film made of aluminum or an alloy of aluminum, or a lamination film including a film made of aluminum or an alloy of aluminum.

52. A method for manufacturing a semiconductor device according to claim 22, wherein the gate electrode is formed by a film made of aluminum or an alloy of aluminum, or a lamination film including a film made of aluminum or an alloy of aluminum.

53. A method for manufacturing a semiconductor device according to claim 28, wherein the gate electrode is formed by a film made of aluminum or an alloy of aluminum, or a lamination film including a film made of aluminum or an alloy of aluminum.

54. A method for manufacturing a semiconductor device according to claim 3, wherein the first interlayer insulating film is a silicon nitride film, and the second interlayer insulating film is organic resin.

55. A method for manufacturing a semiconductor device according to claim 4, wherein the first interlayer insulating film is a silicon nitride film, and the second interlayer insulating film is organic resin.

56. A method for manufacturing a semiconductor device according to claim 5, wherein the first interlayer insulating film is a silicon nitride film, and the second interlayer insulating film is organic resin.

57. A method for manufacturing a semiconductor device according to claim 6, wherein the first interlayer insulating film is a silicon nitride film, and the second interlayer insulating film is organic resin.

58. A method for manufacturing a semiconductor device according to claim 7, wherein the first interlayer insulating film is a silicon nitride film, and the second interlayer insulating film is organic resin.

59. A method for manufacturing a semiconductor device according to claim 8, wherein the first interlayer insulating film is a silicon nitride film, and the second interlayer insulating film is organic resin.

60. A method for manufacturing a semiconductor device according to claim 9, wherein the first interlayer insulating film is a silicon nitride film, and the second interlayer insulating film is organic resin.

61. A method for manufacturing a semiconductor device according to claim 10, wherein the first interlayer insulating film is a silicon nitride film, and the second interlayer insulating film is organic resin.

62. A method for manufacturing a semiconductor device according to claim 11, wherein the first interlayer insulating film is a silicon nitride film, and the second interlayer insulating film is organic resin.

63. A method for manufacturing a semiconductor device according to claim 12, wherein the first interlayer insulating film is a silicon nitride film, and the second interlayer insulating film is organic resin.

64. A method for manufacturing a semiconductor device according to claim 19, wherein the first interlayer insulating film is a silicon nitride film, and the second interlayer insulating film is organic resin.

65. A method for manufacturing a semiconductor device according to claim 22, wherein the first interlayer insulating film is a silicon nitride film, and the second interlayer insulating film is organic resin.

66. A method for manufacturing a semiconductor device according to claim 28, wherein the first interlayer insulating film is a silicon nitride film, and the second interlayer insulating film is organic resin.

* * * * *